US010356891B2

(12) United States Patent
Kim

(10) Patent No.: US 10,356,891 B2
(45) Date of Patent: Jul. 16, 2019

(54) PRINTED CIRCUIT BOARD AND SOLID STATE DRIVE APPARATUS HAVING THE SAME

(71) Applicant: SAMSUNG ELECTRONICS CO., LTD., Suwon-si, Gyeonggi-Do (KR)

(72) Inventor: Jung-Hoon Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/825,856

(22) Filed: Nov. 29, 2017

(65) Prior Publication Data

US 2018/0160523 A1  Jun. 7, 2018

(30) Foreign Application Priority Data

Dec. 2, 2016  (KR) .................. 10-2016-0163902

(51) Int. Cl.
*H05K 7/00* (2006.01)
*H05K 1/02* (2006.01)
(Continued)

(52) U.S. Cl.
CPC ......... *H05K 1/0204* (2013.01); *H05K 1/0272* (2013.01); *H05K 1/117* (2013.01); *H05K 1/181* (2013.01); *H05K 3/4644* (2013.01); *H05K 7/20336* (2013.01); *H05K 3/4697* (2013.01); *H05K 2201/064* (2013.01); *H05K 2201/093* (2013.01); *H05K 2201/09063* (2013.01);
(Continued)

(58) Field of Classification Search
None
See application file for complete search history.

(56) References Cited

U.S. PATENT DOCUMENTS 5,199,165 A * 4/1993 Crawford ............. H01L 23/427
165/104.33
5,268,812 A * 12/1993 Conte ................. F28D 15/0233
165/104.33

(Continued)

FOREIGN PATENT DOCUMENTS

JP         4140100      6/2008
KR      1020050117482  12/2005
(Continued)

*Primary Examiner* — Courtney L Smith
*Assistant Examiner* — Rashen E Morrison
(74) *Attorney, Agent, or Firm* — F. Chau & Associates, LLC

(57) ABSTRACT

A printed circuit board includes a substrate base including first and second inner base layers, a plurality of cover base layers, and a screw hole extending from a top to a bottom surface of the substrate base. At least one first cover base layer is disposed on the first inner base layer. At least one second cover base layer is disposed on the second inner base layer. A heat pipe is disposed along an interface between the first and second inner base layers. A ground conductive layer is disposed on at least one of the top surface and the bottom surface of the substrate base at an edge of the screw hole. A first heat dissipating structure is positioned between the top and bottom surfaces of the substrate base. The first heat dissipating structure is connected to the heat pipe and is in direct contact with the ground conductive layer.

19 Claims, 15 Drawing Sheets

(51) Int. Cl.
  *H05K 7/20*  (2006.01)
  *H05K 1/11*  (2006.01)
  *H05K 1/18*  (2006.01)
  *H05K 3/46*  (2006.01)
(52) U.S. Cl.
  CPC .............. *H05K 2201/10159* (2013.01); *H05K 2201/10416* (2013.01); *H05K 2201/10522* (2013.01)

(56) References Cited

U.S. PATENT DOCUMENTS

| | | | | |
|---|---|---|---|---|
| 5,355,942 | A * | 10/1994 | Conte | F28D 15/0233 165/104.33 |
| 6,133,631 | A * | 10/2000 | Belady | F28D 15/0233 257/714 |
| 6,292,366 | B1 * | 9/2001 | Platt | H01L 23/427 174/252 |
| 6,323,891 | B1 * | 11/2001 | Kitani | G01T 1/2018 257/713 |
| 6,490,159 | B1 * | 12/2002 | Goenka | H05K 1/0272 165/80.4 |
| 6,788,537 | B2 * | 9/2004 | Saita | F28D 15/0233 165/104.33 |
| 7,176,382 | B1 * | 2/2007 | Shi | H05K 1/0272 165/104.33 |
| 7,480,992 | B2 * | 1/2009 | Okamoto | B23K 20/122 165/170 |
| 7,606,035 | B2 | 10/2009 | Park et al. | |
| 7,759,170 | B2 * | 7/2010 | Pu | H01L 23/3157 257/707 |
| 7,960,655 | B2 | 6/2011 | Han et al. | |
| 8,006,747 | B2 * | 8/2011 | Chrysler | F28D 15/0233 165/104.21 |
| 8,044,506 | B2 | 10/2011 | Yun et al. | |
| 9,188,396 | B2 | 11/2015 | Kameoka et al. | |
| 9,553,248 | B2 * | 1/2017 | Lang | H01L 35/30 |
| 2010/0128436 | A1 * | 5/2010 | Edmunds | H01L 23/427 361/700 |
| 2015/0316966 | A1 | 11/2015 | Chen et al. | |
| 2016/0033206 | A1 | 2/2016 | Kameoka et al. | |
| 2016/0037620 | A1 | 2/2016 | Kang et al. | |
| 2016/0088769 | A1 | 3/2016 | Hsiao | |
| 2017/0250120 | A1 * | 8/2017 | Harauchi | H01L 23/36 |
| 2018/0096913 | A1 * | 4/2018 | Park | H01L 23/04 |
| 2018/0160523 | A1 * | 6/2018 | Kim | H05K 1/0272 |

FOREIGN PATENT DOCUMENTS

| | | |
|---|---|---|
| KR | 100791982 | 12/2007 |
| KR | 1020090127645 | 12/2009 |
| KR | 100966341 | 6/2010 |

* cited by examiner

PRINTED CIRCUIT BOARD AND SOLID STATE DRIVE APPARATUS HAVING THE SAME

CROSS-REFERENCE TO RELATED APPLICATION

This application claims priority under 35 U.S.C. § 119 to Korean Patent Application No. 10-2016-0163902, filed on Dec. 2, 2016, in the Korean Intellectual Property Office, the disclosure of which is incorporated by reference herein in its entirety.

TECHNICAL FIELD

Exemplary embodiments of the present inventive concept relate to a printed circuit board, and more particularly to a solid state drive apparatus having the same.

DISCUSSION OF RELATED ART

A solid state drive apparatus is an example of a storage apparatus. A solid state drive apparatus is a non-volatile memory-based storage device, which may have relatively low power consumption and relatively high storage density. When a solid state drive apparatus is used as a storage device, a relatively large amount of data may be input/output at a relatively high speed.

SUMMARY

According to an exemplary embodiment of the present inventive concept, a printed circuit board including a solid state drive apparatus is provided having increased reliability. Heat dissipation of the solid state drive apparatus according to an exemplary embodiment of the present inventive concept may be relatively high.

According to an exemplary embodiment of the present inventive concept, there is provided a printed circuit board including a substrate base including a first inner base layer, a second inner base layer disposed on the first inner base layer, a plurality of cover base layers, and a screw hole extending from a top surface to a bottom surface of the substrate base. At least one first cover base layer of the plurality of cover base layers is disposed on the first inner base layer. At least one second cover base layer of the plurality of cover base layers is disposed on the second inner base layer. A heat pipe is disposed along an interface between the first and second inner base layers. The heat pipe includes a sealed inner space. A ground conductive layer is disposed on at least one of the top surface and the bottom surface of the substrate base at an edge of the screw hole. A first heat dissipating structure is positioned between the top and bottom surfaces of the substrate base. The first heat dissipating structure is connected to the heat pipe and is in direct contact with the ground conductive layer.

According to an exemplary embodiment of the present inventive concept, there is provided a solid state drive apparatus including a printed circuit board and a plurality of semiconductor chips disposed on the printed circuit board. The printed circuit board includes a substrate base including a first inner base layer, a second inner base layer disposed on the first inner base layer, a plurality of cover base layers, and a screw hole extending from a top surface to a bottom surface of the substrate base. At least one first cover base layer of the plurality of cover base layers is disposed on the first inner base layer. At least one second cover base layer of the plurality of cover base layers is disposed on the second inner base layer. A first wire pattern is disposed on the top surface of the substrate base. A second wire pattern is disposed on the bottom surface of the substrate base. Each of the first and second wire patterns is connected to at least one of the plurality of semiconductor chips. A heat pipe is positioned along an interface between the first and second inner base layers. The heat pipe includes a sealed inner space. A ground conductive layer is disposed on at least one of the top surface and the bottom surface of the substrate base around the screw hole. A first heat dissipating structure is positioned between the top and bottom surfaces of the substrate base. The first heat dissipating structure is connected to the heat pipe and is in direct contact with the ground conductive layer.

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION OF THE EMBODIMENTS

FIGS. 1 through 6 are each transparent perspective views of parts of a solid state drive apparatuses having a printed circuit board according to an exemplary embodiment of the present inventive concept.

Figure 1:
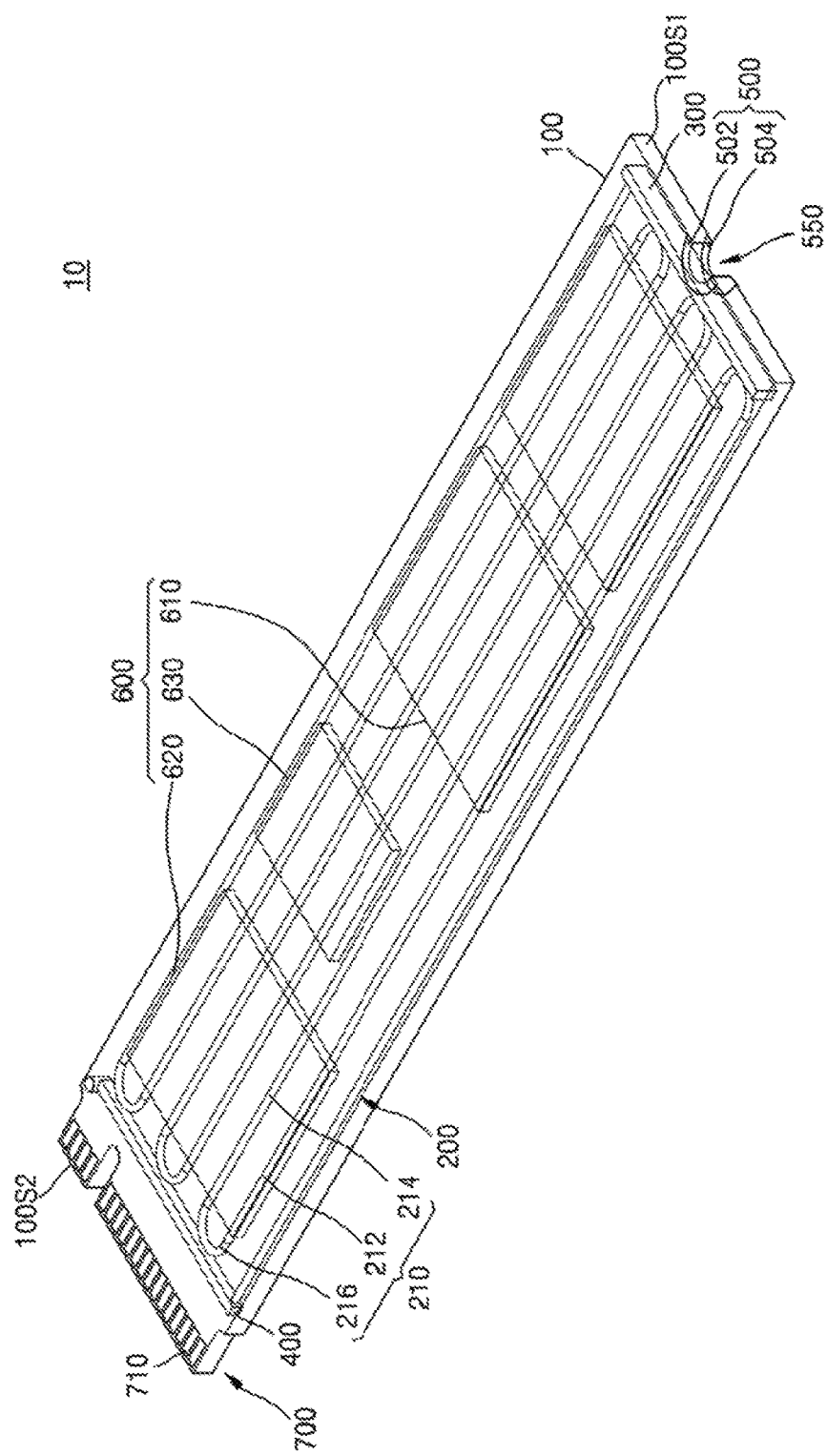
FIGS. 1 through 6 are each transparent perspective views of parts of a solid state drive apparatuses having a printed circuit board according to an exemplary embodiment of the present inventive concept.

FIG. 1 is a transparent perspective view of a solid state drive apparatus including a printed circuit board according to an exemplary embodiment of the present inventive concept.

Referring to FIG. 1, a solid state drive apparatus 10 may include a printed circuit board 100 and a plurality of semiconductor chips 600 disposed on the printed circuit board 100.

A screw hole 550 may be formed at a first end 100S1 of the printed circuit board 100. The screw hole 550 may have a shape recessed inwardly from the first end 100S1 of the printed circuit board 100. According to an exemplary embodiment of the present inventive concept, the screw hole 550 may be formed to penetrate through the printed circuit board 100 at a portion of the printed circuit board 100 adjacent to the first end 100S1 of the printed circuit board 100.

A ground conductive layer 500 may be disposed on one or both top and bottom surfaces of the printed circuit board 100 at an edge of the screw hole 550. For example, the screw hole 550 may have a substantially semicircular shape, and the ground conductive layer 500 may be positioned along a semicircular edge of the screw hole 550 (e.g., on the top and/or bottom surface of the printed circuit board 100). According to an exemplary embodiment of the present inventive concept, the ground conductive layer 500 may include an upper ground conductive layer 502 disposed on the top surface of the printed circuit board 100 and a lower ground conductive layer 504 disposed on the bottom surface of the printed circuit board 100. According to an exemplary embodiment of the present inventive concept, the lower ground conductive layer 504 may be omitted.

A screw may be positioned in the screw hole 550, thus fixing the solid state drive apparatus 10 to a casing or a mainboard.

A connector 700 may be positioned at a second end 100S2 of the printed circuit board 100 opposite to the first end 100S1. The connector 700 may include a plurality of conductive terminals 710 disposed on one or both surfaces of the printed circuit board 100. The plurality of conductive terminals 710 may be arranged in series on one or both surfaces of the printed circuit board 100 along the second end 100S2 of the printed circuit board 100. The plurality of conductive terminals 710 may be connected to a wire pattern 130 (see, e.g., FIG. 8) that is connected to at least one of the plurality of semiconductor chips 600.

The plurality of conductive terminals 710 may be adjacent to the wire pattern 130. For example, the plurality of conductive terminals 710 may be in direct contact with the wire pattern 130. According to an exemplary embodiment of the present inventive concept, the plurality of conductive terminals 710 may be portions of the wire pattern 130.

The solid state drive apparatus 10 may be connected to an external device through the connector 700 and receive signals and/or receive power. The connector 700 may be configured to be connected to an external device in an interface compliant with, for example, the parallel advanced technology attachment (PATA) standard, the serial advanced technology attachment (SATA) standard, the SCSI standard, or the PCI Express (PCIe) standard. Here, the SATA standard covers not only SATA-1, but also all SATA-based standards, such as SATA-2, SATA-3, and e-SATA (external SATA). The PCIe standard covers not only PCIe 1.0, but also all PCIe-based standards, such as PCIe 2.0, PCIe 2.1, PCIe 3.0, and PCIe 4.0. The SCSI standard covers all SCSI-based standards, such as parallel SCSI, serial-attached SA-SCSI (SAS), and iSCSI.

The configuration of the printed circuit board 100 will be described in more detail below with reference to FIG. 8 and with reference to the drawings described thereafter.

The plurality of semiconductor chips 600 may include a plurality of first semiconductor chips 610, at least one second semiconductor chip 620, and at least one third semiconductor chip 630. According to an exemplary embodiment of the present inventive concept, the plurality of semiconductor chips 600 may be disposed on the top surface of the printed circuit board 100. According to an exemplary embodiment of the present inventive concept, the plurality of semiconductor chips 600 may be disposed on both top and bottom surfaces of the printed circuit board 100.

The plurality of first semiconductor chips 610, the at least one second semiconductor chip 620, and the at least one third semiconductor chip 630 may each be disposed one or both of the top and bottom surfaces of the printed circuit board 100 according to storage capacity and/or channel configuration of the solid state drive apparatus 10.

According to an exemplary embodiment of the present inventive concept, the plurality of first semiconductor chips 610 may be disposed on the top and bottom surfaces of the printed circuit board 100. According to an exemplary embodiment of the present inventive concept, the plurality of first semiconductor chips 610 and the at least one second semiconductor chip 620 may be disposed on the top and bottom surfaces of the printed circuit board 100. The plurality of first semiconductor chips 610, the at least one second semiconductor chip 620, and the at least one third semiconductor chip 630 may be disposed on the top and bottom surfaces of the printed circuit board 100, respectively.

The first semiconductor chip 610 may be, for example, a non-volatile memory chip. The first semiconductor chip 610 may be, for example, a NAND flash memory, a resistive random access memory (RRAM), a magnetoresistive RAM (MRAM), a phase-change RAM (PRAM), or a ferroelectric RAM (FRAM). The first semiconductor chip 610 may be a semiconductor package including one non-volatile memory chip or a plurality of stacked non-volatile memory chips.

The second semiconductor chip 620 may be, for example, a controller chip. The second semiconductor chip 620 may provide an interface and a protocol between a host and the first semiconductor chip 610. The second semiconductor chip 620 may provide standard protocols, such as parallel advanced technology attachment (PATA), serial advanced technology attachment (SATA), SCSI, and PCIe (PCI Express), for the interface between the first semiconductor chip 610 and the host. The second semiconductor chip 620 may also perform wear levelling, garbage collection, bad block management, and error correcting code (ECC) for the first semiconductor chip 610.

The third semiconductor chip 630 may be, for example, a volatile memory semiconductor chip, such as dynamic RAM (DRAM). The third semiconductor chip 630 provides a cache, thus scaling an access-time and a data-transfer performance according to processing efficiency of a system including the solid state drive apparatus 10.

The solid state drive apparatus 10 may include an active element or a passive element mounted on or in the printed circuit board 100, such as a chip resistor, a chip capacitor, an inductance, a switch, a temperature sensor, a DC-DC converter, a quartz for generating a clock, or a voltage regulator.

According to an exemplary embodiment of the present inventive concept, the first semiconductor chip 610 may be adjacent to the first end 100S1 of the printed circuit board 100, and the second semiconductor chip 620 may be adjacent the second end 100S2 of the printed circuit board 100. According to an exemplary embodiment of the present inventive concept, the third semiconductor chip 630 may be positioned between the first semiconductor chip 610 and the second semiconductor chip 620 along a direction interconnecting the first end 100S1 and the second end 100S2 of the printed circuit board 100.

A heat pipe 200 may be embedded in the printed circuit board 100. For example, the heat pipe 200 may be positioned between the top and bottom surfaces of the substrate base 110. The heat pipe 200 may have a pipe-like shape having a sealed inner space. According to an exemplary embodiment of the present inventive concept, the heat pipe 200 may have a pipe-like shape with sealed ends. According to an exemplary embodiment of the present inventive concept, the heat pipe 200 may have a pipe-like shape that forms a loop and has the sealed inner space. The heat pipe 200 may be embedded in the printed circuit board 100 and spaced apart from the first end 100S1 and second end 100S2 of the printed circuit board 100.

The heat pipe 200 may be electrically insulated from the plurality of semiconductor chips 600. The heat pipe 200 may be isolated and electrically insulated from the wire pattern 130 (see, e.g., FIG. 8) connected to at least one of the plurality of semiconductor chips 600.

According to an exemplary embodiment of the present inventive concept, the heat pipe 200 may be a single heat pipe embedded and extend in the printed circuit board 100. According to an exemplary embodiment of the present inventive concept, the heat pipe 200 may be a plurality of heat pipes separated from one another and embedded in the printed circuit board 100. The printed circuit board 100 may include a vessel 200V (see, e.g., FIG. 7A) that defines an inner space 200S (see, e.g., FIG. 7A) of the heat pipe 200.

The heat pipe 200 may include a heat absorber 210 having a shape in which a first direction passage 212 and a second direction passage 214 are connected to each other by a bent passage 216. The heat absorber 210 may have a zigzag shape in which the first direction passage 212, the bent passage 216, and the second direction passage 214 are repeatedly connected to one another.

In a direction orthogonal to a top surface of the printed circuit board 100, the heat absorber 210 may overlap at least one of the plurality of semiconductor chips 600. As an example, the heat absorber 210 may be embedded in a portion of the printed circuit board 100 below at least one of the plurality of semiconductor chips 600. The heat absorber 210 may be embedded in the printed circuit board 100 and may overlap all of the first semiconductor chip 610, the second semiconductor chip 620, and the third semiconductor chip 630 along the direction orthogonal to the top surface of the printed circuit board 100.

A first heat dissipating structure 300 in direct contact with the ground conductive layer 500 may be embedded in a portion of the printed circuit board 100 adjacent to the first end 100S1 of the printed circuit board 100. The ground conductive layer 500 may be formed on one or both surfaces of the printed circuit board 100 and may substantially cover a portion (e.g., a top or bottom portion) of the first heat dissipating structure 300. Thus the first heat dissipating structure 300 may be in direct contact with the ground conductive layer 500.

According to an exemplary embodiment of the present inventive concept, the first heat dissipating structure 300 may be connected to the heat pipe 200. The first heat dissipating structure 300 may be in direct thermal contact with the heat pipe 200. According to an exemplary embodiment of the present inventive concept, a first plating layer 192 (see, e.g., FIG. 10C) may be disposed between the first heat dissipating structure 300 and the heat pipe 200 and may provide a thermal contact between the first heat dissipating structure 300 and the heat pipe 200.

According to an exemplary embodiment of the present inventive concept, the first heat dissipating structure 300 may be in direct contact with a portion of the bent passage 216 that is included in the heat pipe 200 and is disposed adjacent to the first end 100S1 of the printed circuit board 100. According to an exemplary embodiment of the present inventive concept, the first plating layer 192 (see, e.g., FIG. 10C) that interconnects the first heat dissipating structure 300 and the heat pipe 200 and may provide a thermal contact between the first heat dissipating structure 300 and the heat pipe 200 may be disposed between the first heat dissipating structure 300 and the bent passage 216 of the heat pipe 200.

Adjacent to the second end 100S2 of the printed circuit board 100, a second heat dissipating structure 400 may be embedded in the printed circuit board 100. The second heat dissipating structure 400 may be spaced apart from the plurality of conductive terminals 710.

The second heat dissipating structure 400 adjacent to the second end 100S2 of the printed circuit board 100 and need not overlap the plurality of conductive terminals 710 in a direction orthogonal to the top surface of the printed circuit board 100.

According to an exemplary embodiment of the present inventive concept, the second heat dissipating structure 400 may be connected to the heat pipe 200. The second heat dissipating structure 400 may be in direct thermal contact with the heat pipe 200. According to an exemplary embodiment of the present inventive concept, a second plating layer 194 (see, e.g., FIG. 10C) may be disposed between the second heat dissipating structure 400 and the heat pipe 200 and may provide a thermal contact between the second heat dissipating structure 400 and the heat pipe 200.

According to an exemplary embodiment of the present inventive concept, the second heat dissipating structure 400 may be in direct contact with a portion of the bent passage 216 that is included in the heat pipe 200 and is adjacent to the second end 100S2 of the printed circuit board 100. According to an exemplary embodiment of the present inventive concept, the second plating layer 194 (see, e.g., FIG. 10C) that interconnects the second heat dissipating structure 400 and the heat pipe 200 and may provide a thermal contact between the second heat dissipating structure 400 and the heat pipe 200 may be disposed between the second heat dissipating structure 400 and the bent passage 216 of the heat pipe 200.

In a direction orthogonal to the top surface of the printed circuit board 100, a thickness of the first heat dissipating structure 300 may be greater than a thickness of the second heat dissipating structure 400.

The first heat dissipating structure 300 and the second heat dissipating structure 400 may include copper or an alloy including copper, for example.

According to an exemplary embodiment of the present inventive concept, the first heat dissipating structure 300 and/or the second heat dissipating structure 400 may have an integral plate-like shape. According to an exemplary embodiment of the present inventive concept, the first heat dissipating structure 300 and/or the second heat dissipating structure 400 may have a plate-like shape in which a plurality of segments are stacked. According to an exemplary embodiment of the present inventive concept, the first heat dissipating structure 300 and/or the second heat dissipating structure 400 may have a mesh-like structure including a plurality of line-shaped conductive patterns and a plurality of conductive plugs interconnecting the plurality of line-shaped conductive patterns.

Heat generated by the plurality of semiconductor chips 600 may be absorbed by the heat absorber 210 of the heat pipe 200 and transferred to the first heat dissipating structure 300 and/or the second heat dissipating structure 400. The heat transferred to the first heat dissipating structure 300 may be transferred to a screw that is positioned in the screw hole 550 through the ground conductive layer 500 and then released to the outside. The heat transferred to the second heat dissipating structure 400 may be absorbed by the plurality of conductive terminals 710 and released to the outside.

Although FIG. 1 shows that the screw hole 550 is formed at the end opposite to the connector 700 in the printed circuit board 100, exemplary embodiments of the present inventive concept are not limited thereto. According to an exemplary embodiment of the present inventive concept, the plurality of screw holes 550 may be formed in the printed circuit board 100. According to an exemplary embodiment of the present inventive concept, the screw holes 550 may be formed at any location in the printed circuit board 100 to secure the printed circuit board 100 to a case or a mainboard.

According to an exemplary embodiment of the present inventive concept, the screw hole 550 may be for fastening a screw to secure the printed circuit board 100 to a case or a mainboard and for fastening a screw to form a heat path for heat dissipation.

In the solid state drive apparatus 10 according to an exemplary embodiment of the present inventive concept, heat generated by the plurality of semiconductor chips 600 may be absorbed by the heat absorber 210 of the heat pipe 200 and transferred to the first heat dissipating structure 300. Since the first heat dissipating structure 300 and the ground conductive layer 500 may be in direct contact with each other and the ground conductive layer 500 may be in direct contact with the screw positioned in the screw hole 550, the heat transferred to the first heat dissipating structure 300 may be transferred to the screw through the ground conductive layer 500 and then released to the outside.

Heat generated by the plurality of semiconductor chips 600 may be absorbed by the heat absorber 210 of the heat pipe 200 and transferred to the second heat dissipating structure 400. Although the second heat dissipating structure 400 and the plurality of conductive terminals 710 may be spaced apart from each other, relatively large portions of the second heat dissipating structure 400 and the plurality of conductive terminals 710 may be adjacent to each other, and thus the heat transferred to the second heat dissipating structure 400 may be absorbed by the plurality of conductive terminals 710 and then released to the outside.

The heat pipe 200 may extend to be alternately connected to the first heat dissipating structure 300 and the second heat dissipating structure 400. Thus, heat that is not transferred to the first heat dissipating structure 300 may be transferred to the second heat dissipating structure 400, whereas heat that is not transferred to the second heat dissipating structure 400 may be transferred to the first heat dissipating structure 300.

The heat transferred to the first heat dissipating structure 300 or the second heat dissipating structure 400 may be transferred to the outside. The remaining heat that is not released to the outside when it reaches the first heat dissipating structure 300 or the second heat dissipating structure 400 may be transferred the other of the second heat dissipating structure 400 or the first heat dissipating structure 300, respectively, and then released to the outside.

Thus, the solid state drive apparatus 10 according to an exemplary embodiment of the present inventive concept may efficiently release internally generated heat, e.g., heat generated by the plurality of semiconductor chips 600, thus increasing the reliability of the solid state drive apparatus 10.

Figure 2:
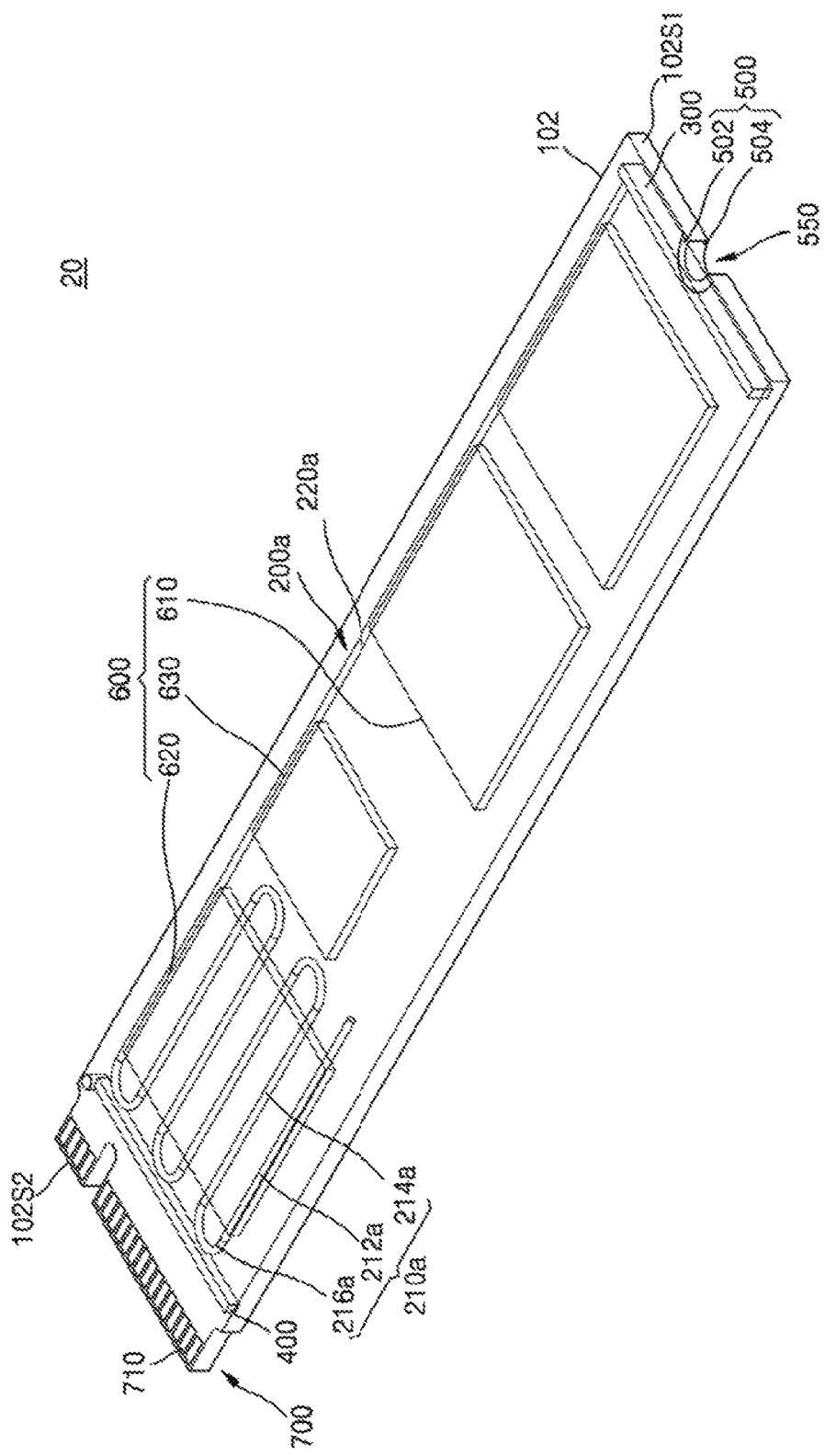

FIG. 2 is a transparent perspective view of a solid state drive apparatus including a printed circuit board according to an exemplary embodiment of the present inventive concept. Descriptions identical to those given above with reference to FIG. 1 may be omitted.

Referring to FIG. 2, a solid state drive apparatus 20 may include a printed circuit board 102 and the plurality of semiconductor chips 600 disposed on the printed circuit board 102.

The screw hole 550 may be formed at a first end 102S1 of the printed circuit board 102. The ground conductive layer 500 may be disposed on one or both of top and bottom surfaces of the printed circuit board 102 around the screw hole 550. The connector 700 may be disposed at a second end 102S2 of the printed circuit board 102 opposite to the first end 102S1. The connector 700 may include the plurality of conductive terminals 710 formed on one or both surfaces of the printed circuit board 102.

The plurality of semiconductor chips 600 may include the plurality of first semiconductor chips 610, the at least one second semiconductor chip 620, and the at least one third semiconductor chip 630. Regions of the printed circuit board 102 in which the first through third semiconductor chips 610, 620 and 630 are positioned may be referred to as first through third chip attaching regions, respectively.

A heat pipe 200a may be embedded in the printed circuit board 102. The heat pipe 200a may be positioned between top and bottom surfaces of the printed circuit board 102. The heat pipe 200a may be embedded in printed circuit board 102 and spaced apart from first end 102S1 and second end 102S2 of printed circuit board 102. The heat pipe 200a may include a heat absorber 210a and a heat transferor 220a extending from the heat absorber 210a.

The heat absorber 210a may have a shape in which a first direction passage 212a and a second direction passage 214a are connected to each other via a bent passage 216a. The heat absorber 210a may have a zigzag shape in which the first direction passage 212a, the bent passage 216a, and the second direction passage 214a are repeatedly connected.

In a direction orthogonal to the top surface of the printed circuit board 102, the heat absorber 210a may overlap some of the plurality of semiconductor chips 600. As an example, the heat absorber 210a may be embedded in a portion of the printed circuit board 102 below some of the plurality of semiconductor chips 600. According to an exemplary embodiment of the present inventive concept, the heat absorber 210a may be disposed in the printed circuit board 102 to overlap the second semiconductor chip 620 and not to overlap the first semiconductor chip 610 and the third semiconductor chip 630 along the direction orthogonal to the top surface of the printed circuit board 102. As an example, from among the first through third chip attaching regions of the printed circuit board 102, the heat absorber 210a may be positioned in the second chip attaching region and need not be positioned in the first chip attaching region and the third chip attaching region.

When the second semiconductor chip 620 is adjacent the second end 102S2 of the printed circuit board 102, the heat absorber 210a may be adjacent to the second end 102S2 of the printed circuit board 102 and the heat transferor 220a may extend from the heat absorber 210a to be adjacent the first end 102S1 of the printed circuit board 102. The heat transferor 220a of the heat pipe 200a may be connected to the first heat dissipating structure 300 and the heat absorber 210a may be connected to the second heat dissipating structure 400.

Figure 3:
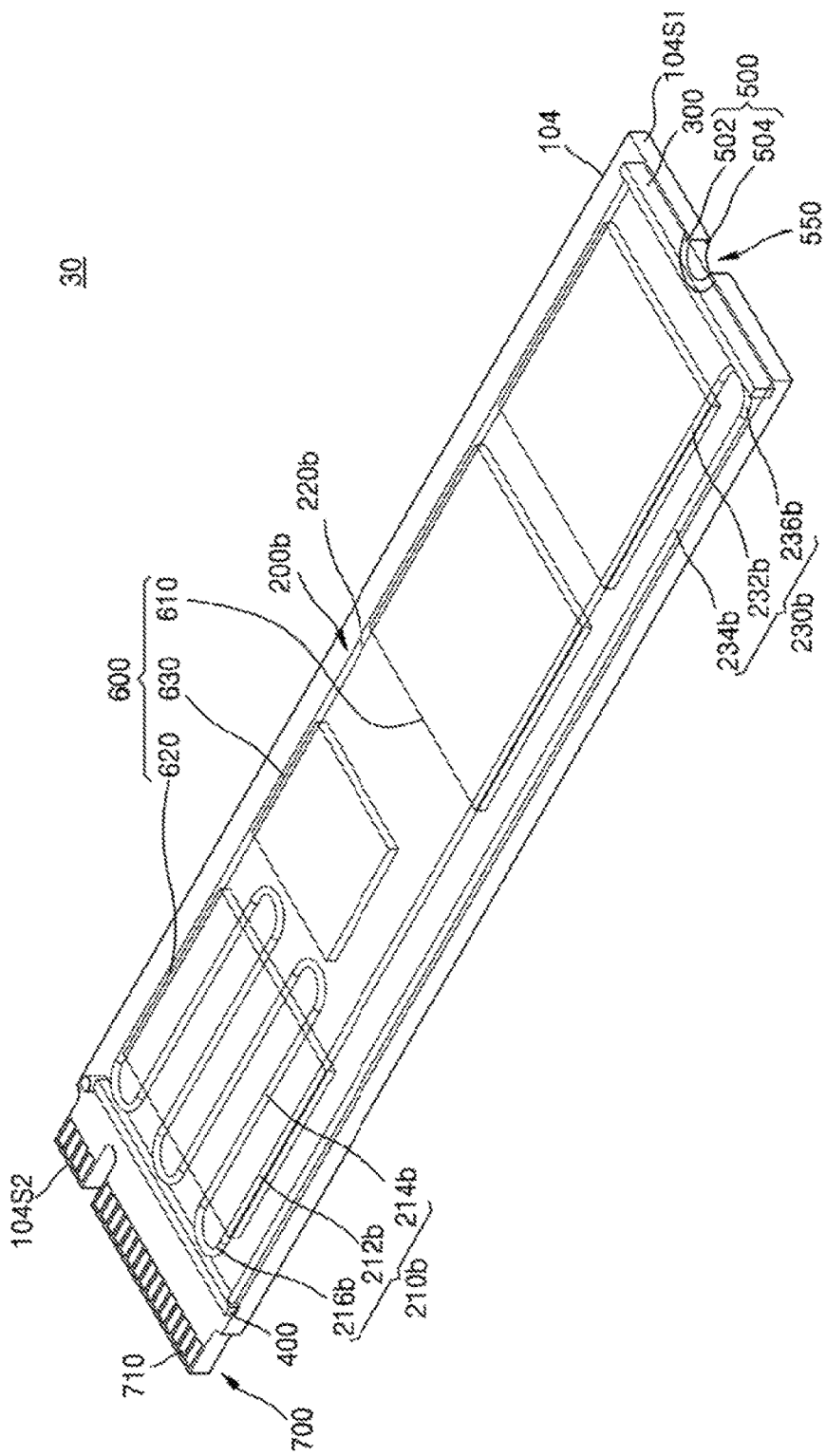

FIG. 3 is a transparent perspective view of a solid state drive apparatus including a printed circuit board according to an exemplary embodiment of the present inventive concept. Descriptions identical to those given above with reference to FIGS. 1 and 2 may be omitted.

Referring to FIG. 3, a solid state drive apparatus 30 may include a printed circuit board 104 and the plurality of semiconductor chips 600 disposed on the printed circuit board 104.

The screw hole 550 may be formed at a first end 104S1 of the printed circuit board 104. The ground conductive layer 500 may be disposed on one or both of top and bottom surfaces of the printed circuit board 104 around the screw hole 550. The connector 700 may be disposed at a second end 104S2 of the printed circuit board 104 opposite to the first end 104S1. The connector 700 may include the plurality of conductive terminals 710 formed on one or both of the top and bottom surfaces of the printed circuit board 104.

The plurality of semiconductor chips 600 may include the plurality of first semiconductor chips 610, the at least one second semiconductor chip 620, and the at least one third semiconductor chip 630. Regions of the printed circuit board 104 to which the first through third semiconductor chips 610, 620 and 630 are attached may be referred to as first through third chip attaching regions, respectively.

A heat pipe 200b may be embedded in the printed circuit board 104. The heat pipe 200b may be embedded in printed circuit board 104 and spaced apart from first end 104S1 and second end 104S2 of printed circuit board 104. The heat pipe 200b may be positioned between the top and bottom surfaces of the printed circuit board 104.

The heat pipe 200b may include a heat absorber 210b and a first heat transferor 220b and a second heat transferor 230b extending from the heat absorber 210b.

The heat absorber 210b may have a shape in which a first direction passage 212b and a second direction passage 214b are connected to each other via a bent passage 216b. The heat absorber 210b may have a zigzag shape in which the first direction passage 212b, the bent passage 216b, and the second direction passage 214b are repeatedly connected.

In a direction orthogonal to the top surface of the printed circuit board 104, the heat absorber 210b may overlap some of the plurality of semiconductor chips 600. As an example, the heat absorber 210b may be embedded in a portion of the printed circuit board 104 below some of the plurality of semiconductor chips 600. According to an exemplary embodiment of the present inventive concept, the heat absorber 210b may be disposed in the printed circuit board 104 to overlap the second semiconductor chip 620 and not to overlap the first semiconductor chip 610 and the third semiconductor chip 630 along the direction orthogonal to the top surface of the printed circuit board 104. As an example, from among the first through third chip attaching regions of the printed circuit board 104, the heat absorber 210b may be disposed in the second chip attaching region and need not be disposed in the first chip attaching region and the third chip attaching region.

When the second semiconductor chip 620 is adjacent to the second end 104S2 of the printed circuit board 104, the heat absorber 210b may be adjacent to the second end 104S2 of the printed circuit board 104 and the heat transferor 220b may extend from the heat absorber 210b to be adjacent to the first end 104S1 of the printed circuit board 104.

The first heat transferor 220b of the heat pipe 200b may extend from the heat absorber 210b and may be connected to the first heat dissipating structure 300, whereas the heat absorber 210b may be connected to the second heat dissipating structure 400.

The second heat transferor 230b of the heat pipe 200b may extend from the heat absorber 210b and may be connected to the first heat dissipating structure 300 and may extend again to be connected to the second heat dissipating structure 400. The second heat transferor 230b may have a shape in which a first direction passage 232b and a second direction passage 234b are connected to each other via a second bent passage 236b. The first direction passage 232b may extend from the heat absorber 210b toward the second bent passage 236b, whereas the second bent passage 236b may extend from the second bent passage 236b and connected to second heat dissipating structure 400.

The second heat transferor 230b may extend from the heat absorber 210b, may be connected to the first heat dissipating structure 300, and may extend again to be connected to the second heat dissipating structure 400. Thus, the remaining heat that is not transferred to the first heat dissipating structure 300 or the remaining heat that is not released by the first heat dissipating structure 300 to the outside may be transferred to the second heat dissipating structure 400.

The remaining of the heat transferred to the second heat dissipating structure 400 that is not released to the outside may be transferred back to the first heat dissipating structure 300 via the heat absorber 210b, and the first heat transferor 220b or the second heat transferor 230b.

Figure 4:
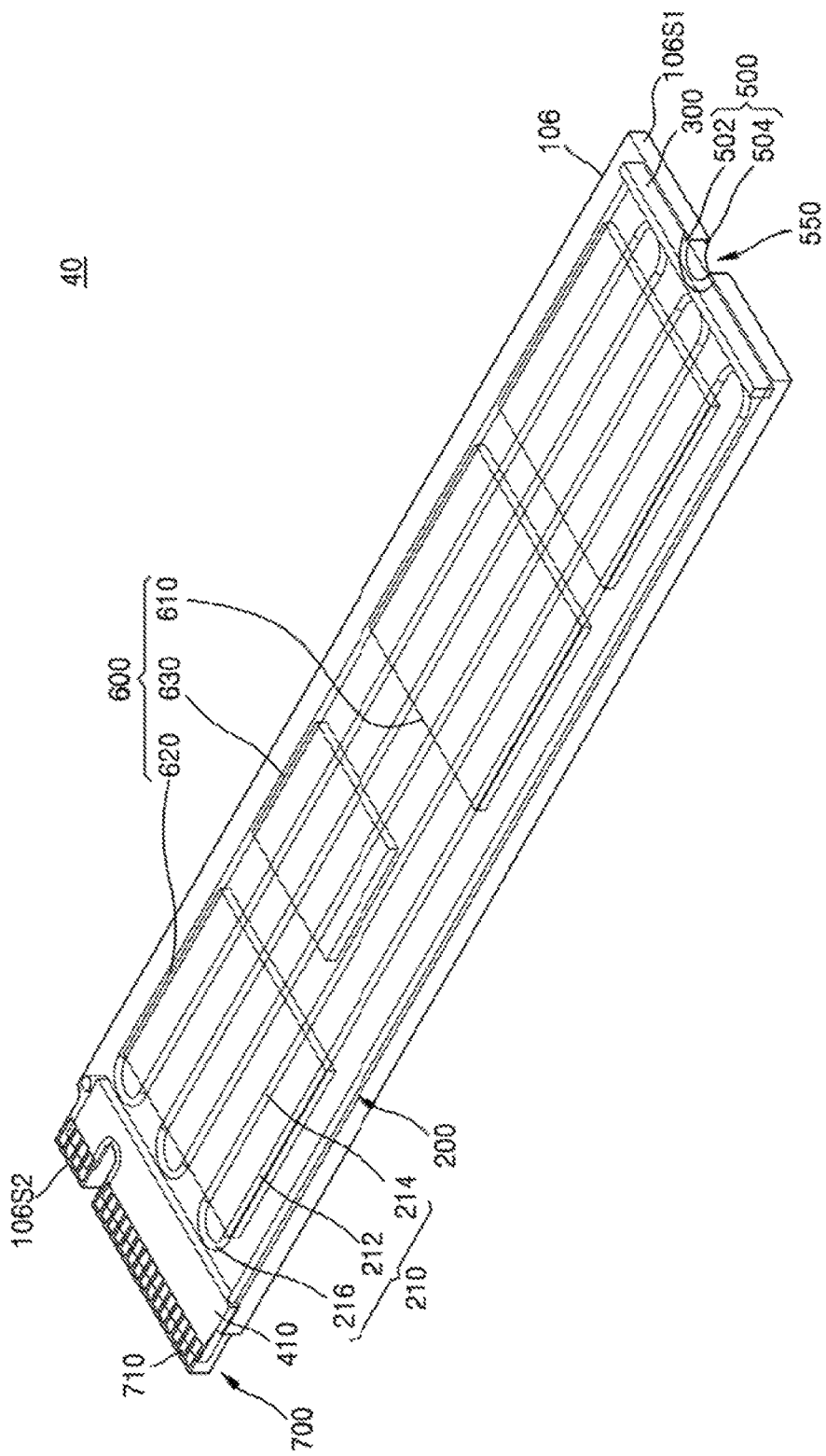

FIG. 4 is a transparent perspective view of a solid state drive apparatus including a printed circuit board according to an exemplary embodiment of the present inventive concept. Descriptions identical to those given above with reference to FIG. 1 may be omitted.

Referring to FIG. 4, a solid state drive apparatus 40 may include a printed circuit board 106 and the plurality of semiconductor chips 600 disposed on the printed circuit board 106.

The screw hole 550 may be formed at a first end 106S1 of the printed circuit board 106. The ground conductive layer 500 may be disposed on one or both of top and bottom surfaces of the printed circuit board 106 around the screw hole 550. The connector 700 may be disposed at a second end 106S2 of the printed circuit board 106 opposite to the first end 106S1. The connector 700 may include the plurality of conductive terminals 710 positioned on one or both of the top and bottom surfaces of the printed circuit board 106.

The heat pipe 200 may be embedded in the printed circuit board 106. The heat pipe 200 may be embedded in printed circuit board 106 and spaced apart from first end 106S1 and second end 106S2 of printed circuit board 106. The heat pipe 200 may be positioned between the top and bottom surfaces of the printed circuit board 106. The heat pipe 200 may include the heat absorber 210 having a shape in which the first direction passage 212 and the second direction passage 214 are connected to each other via the bent passage 216.

Adjacent to the first end 106S1 of the printed circuit board 106, the first heat dissipating structure 300 in direct contact with the ground conductive layer 500 may be embedded in the printed circuit board 106. The first heat dissipating structure 300 may be connected to the heat pipe 200.

Adjacent to the second end 106S2 of the printed circuit board 106, a second heat dissipating structure 410 may be embedded in the printed circuit board 106 and spaced apart from the plurality of conductive terminals 710. The second heat dissipating structure 410 may overlap the plurality of conductive terminals 710 in a direction orthogonal to the top surface of the printed circuit board 106.

In the direction orthogonal to the top surface of the printed circuit board 106, the thickness of the first heat dissipating structure 300 may be greater than the thickness of the second heat dissipating structure 410.

According to an exemplary embodiment of the present inventive concept, the first heat dissipating structure 300 and/or the second heat dissipating structure 410 may have an integral plate-like shape. According to an exemplary embodiment of the present inventive concept, the first heat dissipating structure 300 and/or the second heat dissipating structure 410 may have a plate-like shape in which a plurality of segments are stacked. According to an exemplary embodiment of the present inventive concept, the first heat dissipating structure 300 and/or the second heat dissipating structure 410 may have a mesh-like structure including a plurality of line-shaped conductive patterns and a plurality of conductive plugs interconnecting the plurality of line-shaped conductive patterns.

Figure 5:
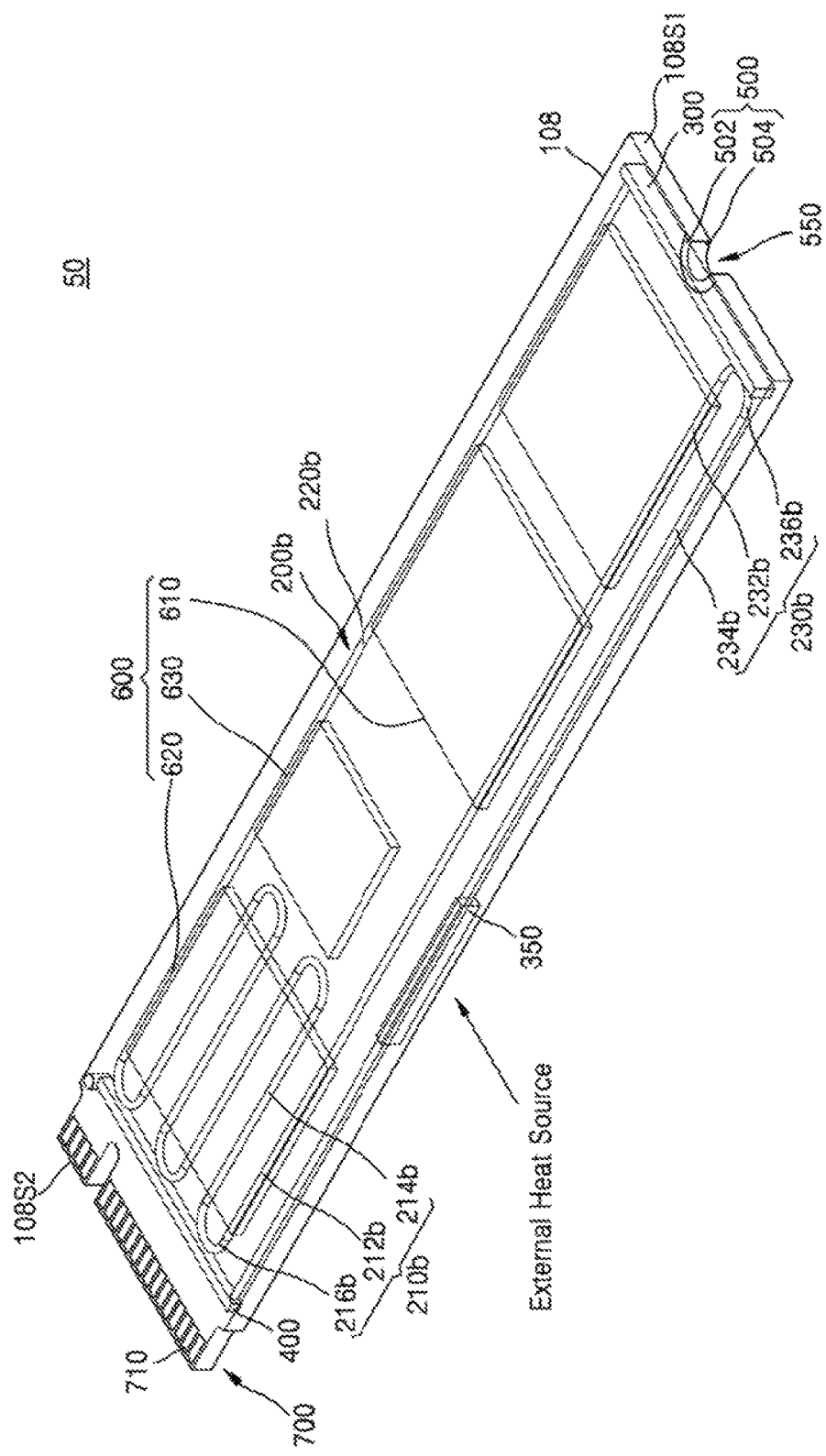

FIG. 5 is a transparent perspective view of a solid state drive apparatus including a printed circuit board according to an exemplary embodiment of the present inventive concept. Descriptions identical to those given above with reference to FIGS. 1 through 4 may be omitted.

Referring to FIG. 5, a solid state drive apparatus 50 may include a printed circuit board 108 and the plurality of semiconductor chips 600 disposed on the printed circuit board 108.

The screw hole 550 may be formed at a first end 108S1 of the printed circuit board 108. The ground conductive layer 500 may be disposed on one or both of top and bottom surfaces of the printed circuit board 108 around the screw hole 550. The connector 700 may be positioned at a second end 108S2 of the printed circuit board 108 opposite to the first end 108S1. The connector 700 may include the plurality of conductive terminals 710 formed on one or both of the top and bottom surfaces of the printed circuit board 108.

The heat pipe 200b may be embedded in the printed circuit board 108. The heat pipe 200b may be embedded in printed circuit board 108 and spaced apart from first end 108S1 and second end 108S2 of printed circuit board 108. The heat pipe 200b may be positioned between the top and bottom surfaces of the printed circuit board 108. The heat pipe 200b may include the heat absorber 210b and the first heat transferor 220b and the second heat transferor 230b extending from the heat absorber 210b.

The heat absorber 210b may have a shape in which the first direction passage 212b and the second direction passage 214b are connected to each other via the bent passage 216b. The heat absorber 210b may have a zigzag shape in which the first direction passage 212b, the bent passage 216b, and the second direction passage 214b are repeatedly connected.

When the second semiconductor chip 620 is adjacent the second end 108S2 of the printed circuit board 108, the heat absorber 210b may be adjacent to the second end 108S2 of the printed circuit board 108 and the heat transferor 220b may extend from the heat absorber 210b to be adjacent the first end 108S 1 of the printed circuit board 108.

The first heat transferor 220b of the heat pipe 200b may extend from the heat absorber 210b and may be connected to the first heat dissipating structure 300, whereas the heat absorber 210b may be connected to the second heat dissipating structure 400.

The second heat transferor 230b of the heat pipe 200b may extend from the heat absorber 210b and may be connected to the first heat dissipating structure 300 and extend again to be connected to the second heat dissipating structure 400. The second heat transferor 230b may have a shape in which the first direction passage 232b and the second direction passage 234b are connected to each other via the second bent passage 236b. The first direction passage 232b may extend from the heat absorber 210b to the second bent passage 236b, the second bent passage 236b may be connected to the first heat dissipating structure 300, and the first direction passage 232b may extend from the second bent passage and may be connected to the second heat dissipating structure 400.

A heat absorbing structure 350 may be connected to the second heat transferor 230b. According to an exemplary embodiment of the present inventive concept, the heat absorbing structure 350 may be connected to the second direction passage 234b of the second heat transferor 230b. Since a method of connecting the heat absorbing structure 350 to the second heat transferor 230b may be similar to the method of connecting the first heat dissipating structure 300 to the heat pipe 200 or the method of connecting the second heat dissipating structure 400 to the heat pipe 200 described above with reference to FIG. 1, detailed description thereof may be omitted. The heat absorbing structure 350 may be formed by a similar method to the method for forming the first heat dissipating structure 300. Thus, the heat absorbing structure 350 may have a similar shape as the first heat dissipating structure 300, and thus detailed description thereof may be omitted.

The heat absorbing structure 350 may be adjacent to a portion of a side surface of the printed circuit board 108 adjacent to an external heat source. In a system including the solid state drive apparatus 50, when there is an external heat source nearby the solid state drive apparatus 50, heat released by the external heat source may be absorbed by the solid state drive apparatus 50 and may affect performance of the solid state drive apparatus 50.

Heat released from the external heat source and absorbed by the heat absorbing structure 350 may be transferred to the first heat dissipating structure 300 and/or the second heat dissipating structure 400 through the second heat transferor 230b and then released to the outside. Thus, the heat released from the external heat source need not affect the plurality of semiconductor chips 600 in the solid state drive apparatus 50, and thus the reliability of the solid state drive apparatus 50 may be increased.

Figure 6:
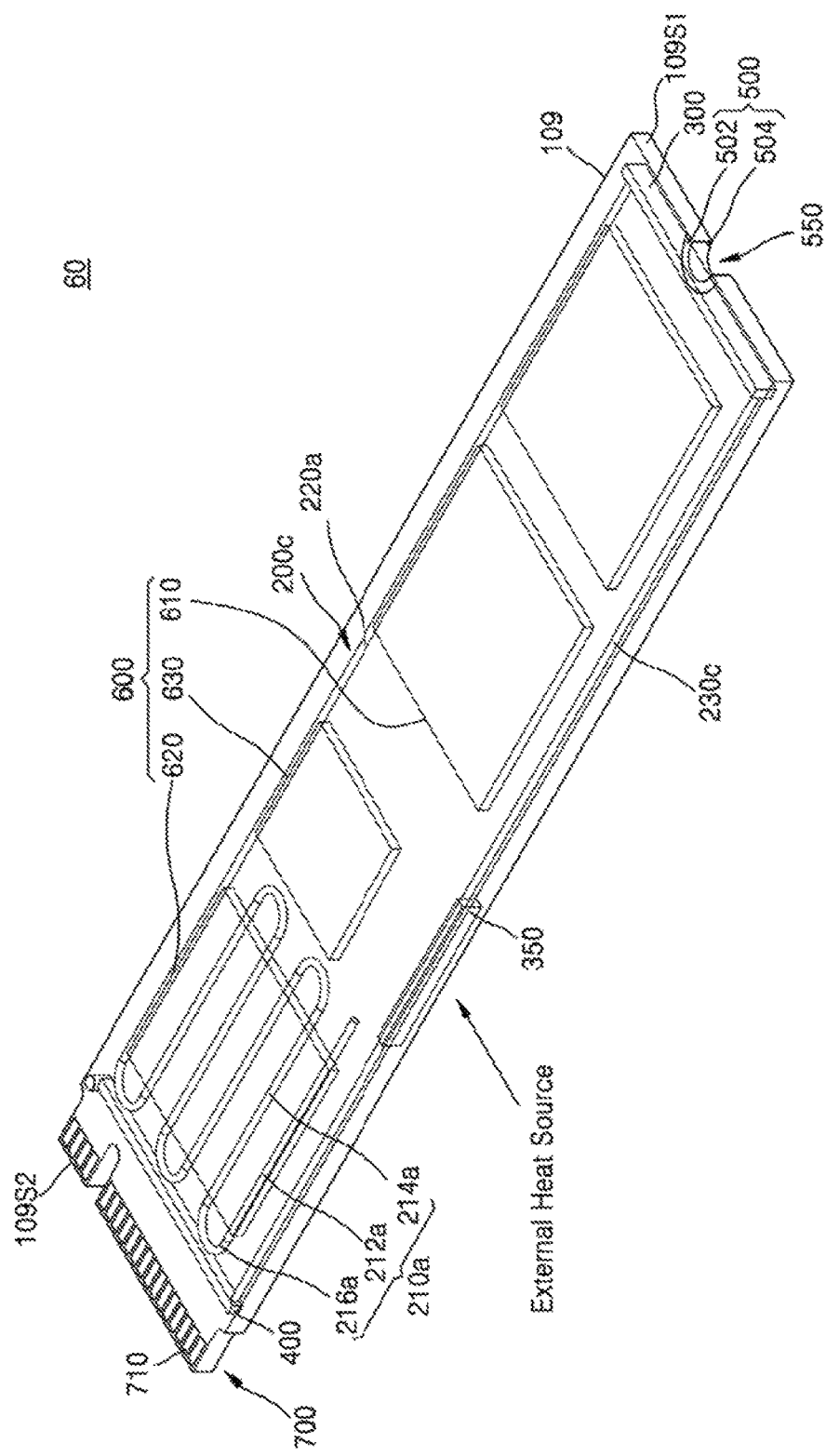

FIG. 6 is a transparent perspective view of a solid state drive apparatus including a printed circuit board according to an exemplary embodiment of the present inventive concept. Descriptions identical to those given above with reference to FIGS. 2 and 5 may be omitted.

Referring to FIG. 6, a solid state drive apparatus 60 may include a printed circuit board 109 and the plurality of semiconductor chips 600 disposed on the printed circuit board 109.

The screw hole 550 may be formed at a first end 109S1 of the printed circuit board 109. The ground conductive layer 500 may be disposed on one or both of top and bottom surfaces of the printed circuit board 109 around the screw hole 550. The connector 700 may be disposed at a second end 109S2 of the printed circuit board 109 opposite to the first end 109S1. The connector 700 may include the plurality of conductive terminals 710 formed on one or both of the top and bottom surfaces of the printed circuit board 109.

A heat pipe 200c may be embedded in the printed circuit board 109. The heat pipe 200c may be embedded in printed circuit board 109 and spaced apart from first end 109S1 and second end 109S2 of printed circuit board 109. The heat pipe 200c may be positioned between the top and bottom surfaces of the printed circuit board 109.

The heat pipe 200c may include the heat absorber 210a, the first heat transferor 220a extending from the heat absorber 210a, and a second heat transferor 230c separated from the heat absorber 210a and the first heat transferor 220a. Since the heat absorber 210a and the first heat transferor 220a included in the heat pipe 200c are similar to the heat absorber 210a and the heat transferor 220a included in the heat pipe 200a shown in FIG. 2, detailed description thereof may be omitted.

The second heat transferor 230c may have a pipe-like shape having a sealed inner space. Ends of the second heat transferor 230c may be connected to the first heat dissipating structure 300 and the second heat dissipating structure 400, respectively. The heat absorbing structure 350 may be connected to the second heat transferor 230c.

Since the second heat transferor 230c may have a pipe-like shape having a separate inner space separated from the heat absorber 210a and the first heat transferor 220a, heat released by the external heat source and absorbed by the heat absorbing structure 350 may be transferred to the first heat dissipating structure 300 and/or the second heat dissipating structure 400 through the second heat transferor 230c and then released to the outside without being directly transferred to the heat absorber 210a and the first heat transferor 220a. Thus, an influence of heat released by the external heat source to the plurality of semiconductor chips 600 may be reduced or eliminated, thus increasing the reliability of the solid state drive apparatus 60.

Figure 7A:
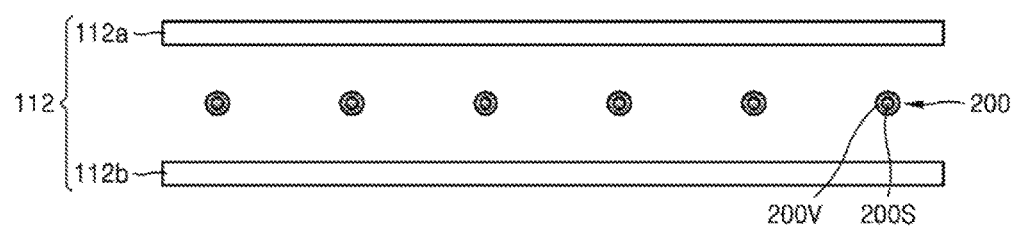
FIGS. 7A and 7B are cross-sectional diagrams illustrating a method of fabricating a printed circuit board according to an exemplary embodiment of the present inventive concept.
Figure 7B:
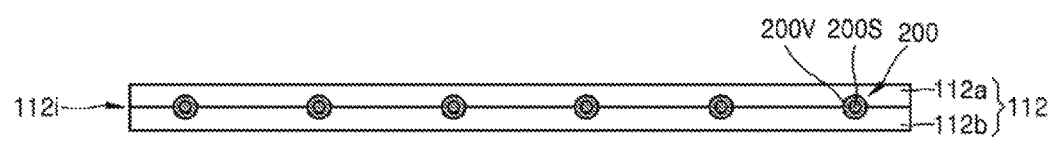

FIGS. 7A and 7B are cross-sectional diagrams illustrating a method of fabricating a printed circuit board according to an exemplary embodiment of the present inventive concept.

Referring to FIG. 7A, a pair of inner base layers 112 including an upper inner base layer 112a and a lower inner base layer 112b and the heat pipe 200 may be provided. The heat pipe 200 described with reference to FIG. 1 may be replaced with the heat pipes 200a, 200b, and 200c described with reference to FIGS. 2 through 6. According to an exemplary embodiment of the present inventive concept, the heat pipe 200 may have a diameter of from about 50 μm to about 300 μm.

The heat pipe 200 may include the vessel 200V defining the inner space 200S. The vessel 200V may have a sealed pipe-like shape defining the inner space 200S. The inner space 200S may have an accommodation space for accommodating a fluid and a spare space that is not filled with a fluid. As an example, the inner space 200S of the heat pipe 200 may only be partially filled with a fluid. The vessel 200V may include copper, nickel, stainless steel, or aluminum, for example. A fluid that partially fills the inner space 200S may be liquid ammonia, methanol, water, or acetone, for example.

Referring to FIG. 7B, the inner baser layer 112 in which the heat pipe 200 is installed may include an interface 112i between the upper inner base layer 112a and the lower inner base layer 112b. The interface 112i may be formed by positioning (e.g., laminating) the heat pipe 200 between the upper inner base layer 112a and the lower inner base layer 112b.

According to an exemplary embodiment of the present inventive concept, the thickness of the inner base layer 112 may be from about 100 μm to about 400 μm. For example, the thicknesses of each of the upper inner base layer 112a and the lower inner base layer 112b may be from about 50 μm to about 200 μm, respectively. The diameter of the heat pipe 200 may be smaller than the thickness of the inner base layer 112. Therefore, the heat pipe 200 may be embedded in the inner base layer 112 without being exposed from the top and bottom surfaces of the inner base layer 112.

Figure 8:
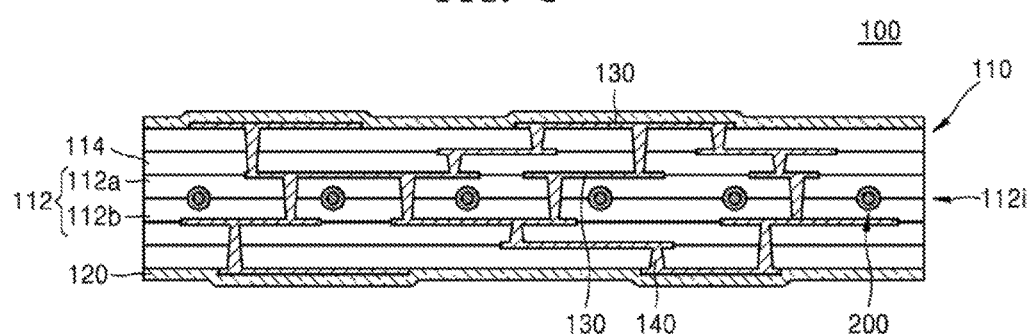
FIGS. 8 and 9 are each cross-sectional views of a printed circuit board according to an exemplary embodiment of the present inventive concept.
Figure 9:
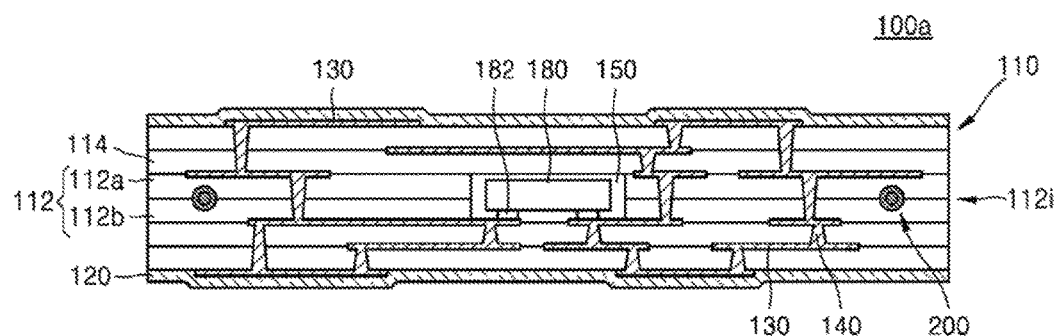

FIGS. 8 and 9 are each cross-sectional views of a printed circuit board according to an exemplary embodiment of the present inventive concept.

FIG. 8 is a cross-sectional view of a printed circuit board according to an exemplary embodiment of the present inventive concept.

Referring to FIG. 8, a substrate base 110 may include one or more cover base layers 114 on both of top and bottom surfaces of the inner base layer 112. The cover base layers 114 may include a plurality of cover base layers 114 stacked on one or both of the top and bottom surfaces of the inner base layer. For example, two cover base layers 114 may be stacked on each of the top and bottom surfaces of the inner base layer 112.

The upper inner base layer 112a, the lower inner base layer 112b, and the cover base layer 114 included in the substrate base 110 may include at least one material selected from phenol resin, epoxy resin, or polyimide. For example, the upper inner base layer 112a, the lower inner base layer 112b, and the cover base layer 114 included in the substrate base 110 may include at least one material selected from Frame Retardant 4 (FR4), a tetrafunctional epoxy, polyphenylene ether, epoxy/polyphenylene oxide, bismaleimide triazine (BT), Thermount, cyanate ester, polyimide, or a liquid crystal polymer.

A wire layer including the wire pattern 130 may be disposed on the top surface and the bottom surface of the cover base layer 114. Thus, a plurality of wire layers respectively disposed on the top and bottom surfaces of the cover base layer 114 may be arranged at the substrate base 110.

The wire pattern 130 need not be positioned inside the inner baser layer 112. For example. The wire pattern 130 need not be positioned at the interface 112i between the upper inner base layer 112a and the lower inner base layer 112b where the heat pipe 200 is positioned. Thus, the wire layer need not be positioned at the interface 112i between the upper inner base layer 112a and the lower inner base layer 112b.

When the plurality of cover base layers 114 are stacked on a surface of the inner base layer 112, the wire layer may be positioned at the interfaces between the plurality of stacked cover base layers 114. The wire layer may also be positioned at the interfaces between the upper and lower inner base layers 112a and 112b and the cover base layer 114.

Through vias 140 may be arranged in the substrate base 110 to interconnect wire patterns 130 included in different wire layers. The through via 140 may penetrate through the inner base layer 112 or the cover base layer 114 and electrically interconnect the wire patterns 130 included in different wire layers. Thus, although the wire pattern 130 need not be disposed inside the substrate base 110, the through via 140 may be formed inside the substrate base 110. The through via 140 penetrating through the substrate base 110 may be spaced apart from the heat pipe 200.

The wire pattern 130 and/or the through via 140 may include copper, nickel, stainless steel, or beryllium copper.

A solder resist layer 120 substantially covering at least portions of the wire patterns 130 disposed on the top and bottom surfaces of the substrate base 110 may be disposed on the top and bottom surfaces of the substrate base 110. The portions of the wire patterns 130 disposed on the top and bottom surfaces of the substrate base 110 and not covered by the solder resist layer 120 may be used as a pad 135*a* (see, e.g., FIG. 17) to be electrically connected to a semiconductor chip, an active device, or a passive device attached to the top or bottom surface of the printed circuit board 100. According to an exemplary embodiment of the present inventive concept, the portions of the wire patterns 130 disposed on the top and bottom surfaces of the substrate base 110 and are not covered by the solder resist layer 120 may include the conductive terminals 710 (see, e.g., FIG. 1).

FIG. 9 is a cross-sectional view of a printed circuit board according to an exemplary embodiment of the present inventive concept. Descriptions identical to those given above with reference to FIG. 8 may be omitted.

Referring to FIG. 9, a printed circuit board 100*a* may include the substrate base 110, the solder resist layer 120, the wire pattern 130, and the through via 140. The inner base layer 112 of the substrate base 110 may have a cavity 150. An embedded passive element 180 electrically connected to the wire pattern 130 may be installed at the cavity 150. The embedded passive element 180 may be electrically connected to the wire pattern 130 via an internal connection terminal 182.

The cavity 150 may be disposed in a portion of the inner base layer 112 without the heat pipe 120. The cavity 150 may be spaced apart from the heat pipe 120.

Figure 10A:
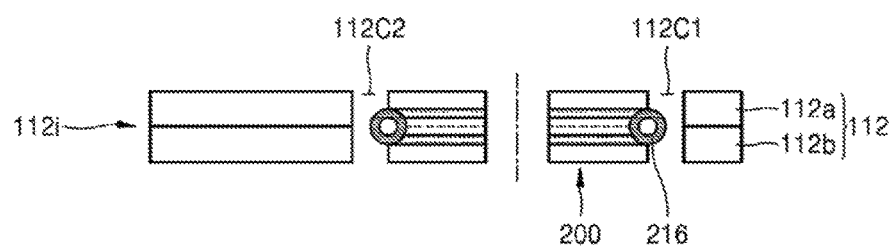
FIGS. 10A through 10C are cross-sectional diagrams illustrating a method of fabricating a printed circuit board according to an exemplary embodiment of the present inventive concept.
Figure 10B:
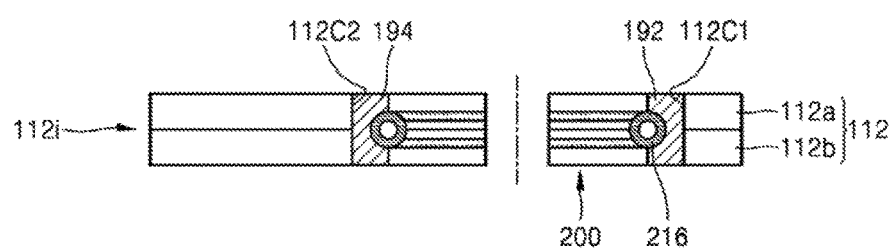
Figure 10C:
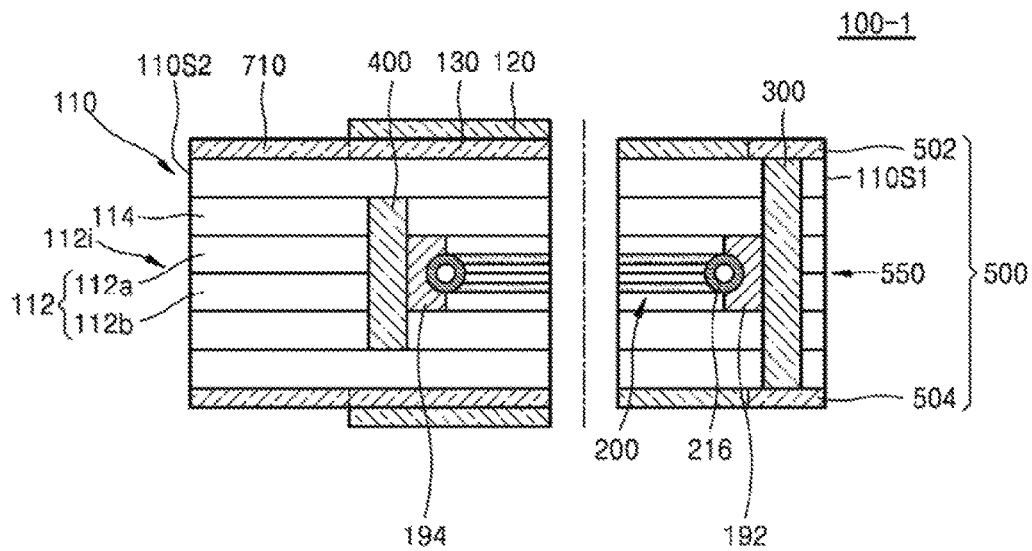

FIGS. 10A through 10C are cross-sectional diagrams illustrating a method of fabricating a printed circuit board according to an exemplary embodiment of the present inventive concept.

Referring to FIG. 10A, the inner base layer 112 may have a first cavity 112C 1 and a second cavity 112C2. The first cavity 112C 1 may be adjacent to the first end 100S1 of the printed circuit board 100 described with reference to FIG. 1, whereas the second cavity 112C2 may be adjacent to the second end 100S2.

Portions of the heat pipe 200 may be exposed in the first and second cavities 112C1 and 112C2. The first and second cavities 112C1 and 112C2 may be positioned at portions of the inner base layer 112C corresponding to locations between the first and second heat dissipating structures 300 and 400 and the heat pipe 200 (see, e.g., FIG. 1).

According to an exemplary embodiment of the present inventive concept, the first and second cavities 112C1 and 112C2 may be first formed in the upper inner base layer 112*a* and the lower inner base layer 112*b*, respectively, and then the inner base layer 112 may be formed by laminating the heat pipe 200 between the upper inner base layer 112*a* and the lower inner base layer 112*b*.

According to an exemplary embodiment of the present inventive concept, the first and second cavities 112C1 and 112C2 may be formed by forming the inner base layer 112 having installed therein the heat pipe 200 (see, e.g., FIG. 7B) and removing a portion of the inner base layer 112 to expose a portion of the heat pipe 200.

Although FIG. 10A shows that a portion of the bent passage 216 of the heat pipe 200 is exposed in the first and second cavities 112C 1 and 112C2, exemplary embodiments of the present inventive concept are not limited thereto, and end portions of the heat pipe 200 connected to the first and second heat dissipating structures 300 and 400 may be exposed.

Referring to FIG. 10B, first and second plating layers 192 and 194 may substantially fill the first and second cavities 112C1 and 112C2, respectively. Since portions of the heat pipe 200 are exposed in the first and second cavities 112C 1 and 112C2, the first and second plating layers 192 and 194 filling the first and second cavities 112C1 and 112C2 may contact the heat pipe 200. The first and second plating layers 192 and 194 may include copper or an alloy including copper, for example.

Referring to FIG. 10C, the substrate base 110 may be formed by stacking the one or more cover base layers 114 on both of the top and bottom surfaces of the inner base layer 112.

After the substrate base 110 is formed, the first heat dissipating structure 300 extending from the top surface of the substrate base 110 into the substrate base 110 may be embedded in the substrate base 110. The first heat dissipating structure 300 may be in direct contact with the first plating layer 192. Next, the ground conductive layer 500 substantially covering a portion of the first heat dissipating structure 300 and in direct contact with the first heat dissipating structure 300 may be formed around the screw hole 550 of the first end 110S1 of the substrate base 110.

According to an exemplary embodiment of the present inventive concept, the first heat dissipating structure 300 may be separately formed and then installed to be embedded in the substrate base 110. According to an exemplary embodiment of the present inventive concept, the first heat dissipating structure 300 may be formed by filling a space, which is formed by removing a portion of the substrate base 110, using a method like plating.

When the ground conductive layer 500 includes the upper ground conductive layer 502 disposed on the top surface of the substrate base 110 and the lower ground conductive layer 504 disposed on the bottom surface of the substrate base 110, the first heat dissipating structure 300 may extend from the top surface of the substrate base 110 to the bottom surface of the substrate base 110.

The wire pattern 130 may be formed on the top surface and/or the bottom surface of the substrate base 110. A solder resist layer 120 substantially covering at least a portion of the wire pattern 130 may be formed on the upper and bottom surfaces of the substrate base 110, thus forming a substrate base (e.g., a substrate base 110-1).

According to an exemplary embodiment of the present inventive concept, the ground conductive layer 500 may be formed together with the wire pattern 130, but the ground conductive layer 500 may be electrically insulated from the wire pattern 130.

At a second end 110S2 of the substrate base 110 opposite to a first end 110S1 of the substrate base 110, the conductive terminal 710 may be positioned on one or both of top and bottom surfaces of the substrate base 110. The conductive terminal 710 may be formed together with the wire pattern 130 to be connected to the wire pattern 130. According to an exemplary embodiment of the present inventive concept, the plurality of conductive terminals 710 may be positioned at the connector 700 of the wire pattern 130. The conductive terminals 710 might not be covered by the solder resist layer 120.

The second heat dissipating structure 400 may be formed before the cover base layers 114 closest to the top and bottom surfaces of the substrate base 110 are stacked. Thus, the second heat dissipating structure 400 may be spaced apart and electrically insulated from the conductive terminal 710 via the cover base layers 114 closest to the top and bottom surfaces of the substrate base 110. The second heat dissipating structure 400 may be adjacent to the second end 110S2 of the substrate base 110, but need not overlap the plurality of conductive terminals 710 in a direction orthogonal to the top surface of the substrate base 110.

The second heat dissipating structure 400 may be formed using a method similar to the method of forming the first heat dissipating structure 300. The second heat dissipating structure 400 may be in direct contact with the second plating layer 194.

According to an exemplary embodiment of the present inventive concept, when the one cover base layer 114 is stacked on each surface of the inner base layer 112, the second heat dissipating structure 400 may be positioned only in the inner base layer 112. According to an exemplary embodiment of the present inventive concept, when the two cover base layers 114 are stacked on each surface of the inner base layer 112, the second heat dissipating structure 400 may be positioned in the inner baser layer 112 and the cover base layers 114 each stacked on the respective surfaces of the inner baser layer 112. Similarly, when the three cover base layers 114 are stacked on each surface of the inner base layer 112, the second heat dissipating structure 400 may be positioned in the cover base layers 114 excluding the cover base layers 114 closest to the top and bottom surfaces of the substrate base 110 and in the inner baser layer 112

Thus, the printed circuit board 100-1 may be formed.

Since the substrate base 110 occupies the largest portion of the printed circuit board 100-1, the first end 110S1 and the second end 110S2 of the substrate base 110 may also be referred to as a first end of the printed circuit board 100-1 and a second end portion of the printed circuit board 100-1, respectively.

Figure 11A:
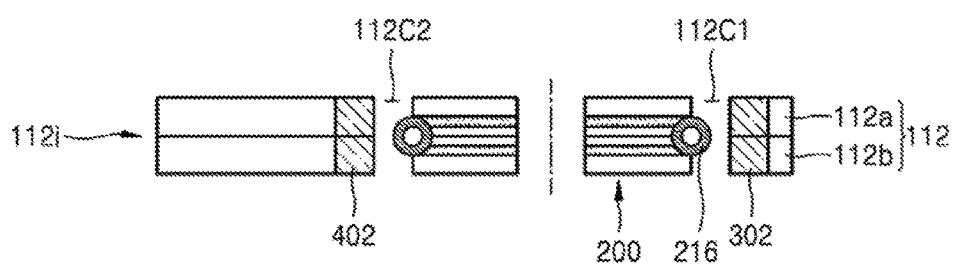
FIGS. 11A through 11C are cross-sectional diagrams illustrating a method of fabricating a printed circuit board according to an embodiment of the inventive concept.
Figure 11B:
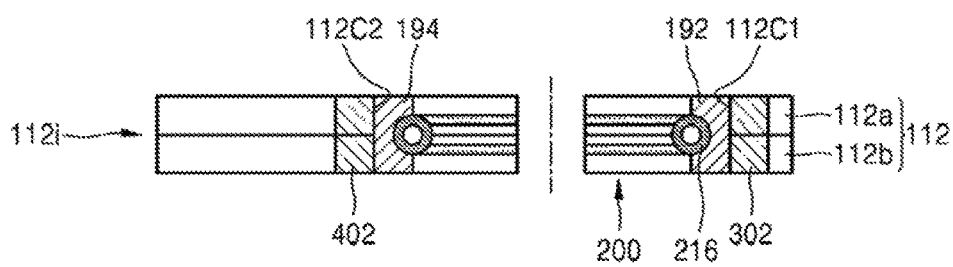
Figure 11C:
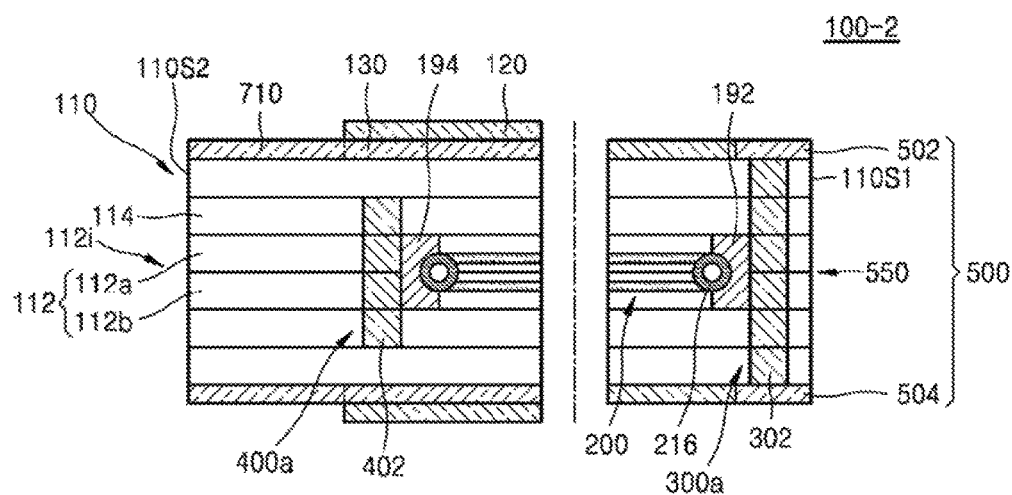

FIGS. 11A through 11C are cross-sectional diagrams illustrating a method of fabricating a printed circuit board according to an embodiment of the inventive concept. Descriptions identical to those given above with reference to FIGS. 10A through 10C may be omitted.

Referring to FIG. 11A, the upper inner base layer 112a and the lower inner base layer 112b may have a first segment 302 and a second segment 402, respectively. The first segment 302 and the second segment 402 may be respectively positioned in the upper inner base layer 112a and the lower inner base layer 112b before the inner baser layer 112 is formed by laminating the upper inner base layer 112a and the lower inner base layer 112b.

The first segment 302 and the second segment 402 may correspond to portions of a first heat dissipating structure 300a and a second heat dissipating structure 400a (see, e.g., FIG. 11C), respectively.

Referring to FIG. 11B, the first and second plating layers 192 and 194 may substantially fill the first and second cavities 112C1 and 112C2, respectively. The first plating layer 192 may be in direct contact with the heat pipe 200 and the first segment 302 and may interconnect the heat pipe 200 and the first segment 302. The second plating layer 194 may be in direct contact with the heat pipe 200 and the second segment 402 and may interconnect the heat pipe 200 and the second segment 402.

Referring to FIG. 11C, the cover base layer 114, the wire pattern 130, the ground conductive layer 500, and the conductive terminal 710 may be formed, thus forming a printed circuit board 100-2.

The first heat dissipating structure 300a may be a stacked structure including the first segments 302 of the upper inner base layer 112a, the lower inner base layer 112b, and the cover base layer 114.

The second heat dissipating structure 400a may be a stacked structure including second segments 402 of the upper inner base layer 112a, the lower inner base layer 112b, and a portion of the cover base layer 114.

The first segment 302 and the second segment 402 may be formed individually on the upper and lower base layers 112a and 112b and the cover base layer 114 included in the substrate base 110. The thickness of each of the first segment 302 and the second segment 402 may be substantially equal to the thickness of the upper base layer 112a, lower base layer 112b, or cover base layer 114 in which they are formed.

The first heat dissipating structure 300a and the second heat dissipating structure 400a described with reference to FIG. 11C may each be a stacked structures including the first segment 302 and the second segment 402.

Figure 12:
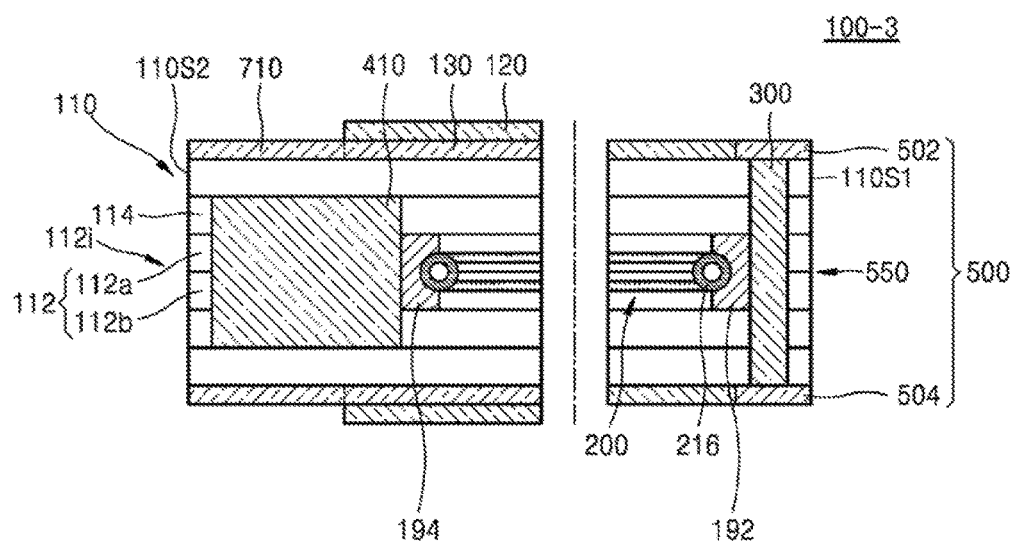
FIGS. 12 and 13 are each cross-sectional views of a printed circuit board according to an exemplary embodiment of the present inventive concept.
Figure 13:
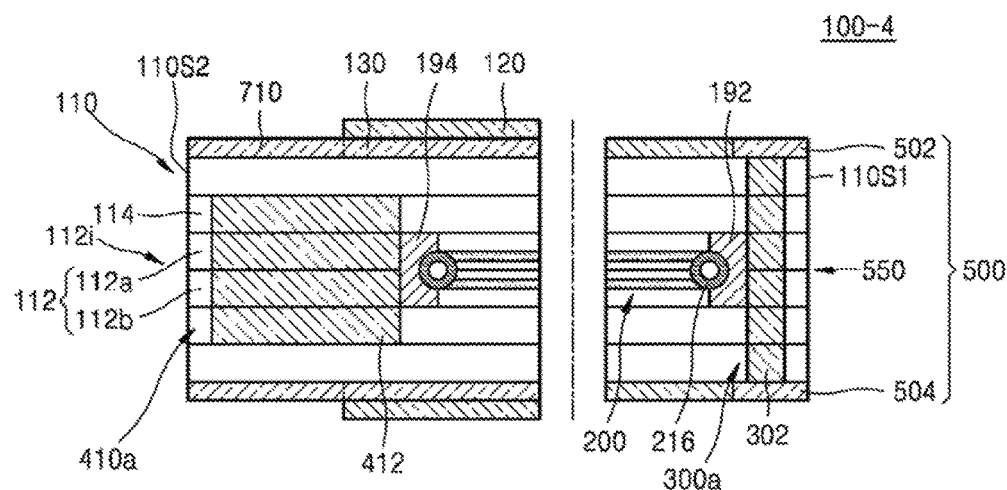

FIGS. 12 and 13 are each cross-sectional views of a printed circuit board according to an exemplary embodiment of the present inventive concept.

FIG. 12 is a partial cross-sectional view of a printed circuit board according to an exemplary embodiment of the present inventive concept. Descriptions identical to those given above with reference to FIG. 10C may be omitted.

Referring to FIG. 12, a printed circuit board 100-3 may include the first heat dissipating structure 300 and the second heat dissipating structure 410 in the substrate base 110.

The second heat dissipating structure 410 may be adjacent to the second end 110S2 of the substrate base 110, and may overlap the plurality of conductive terminals 710 in a direction orthogonal to the top surface of the substrate base 110.

Compared to the second heat dissipating structure 400 described with reference to FIG. 10C, the second heat dissipating structure 410 described with reference to FIG. 12 may further extend from the heat pipe 200 toward the second end 110S2 of the substrate base 110.

FIG. 13 is a partial cross-sectional view of a printed circuit board according to an exemplary embodiment of the present inventive concept. Descriptions identical to those given above with reference to FIG. 11C may be omitted.

Referring to FIG. 13, a printed circuit board 100-4 may include the first heat dissipating structure 300a and a second heat dissipating structure 410a in the substrate base 110.

The second heat dissipating structure 410a may be adjacent to the second end 110S2 of the substrate base 110, and may overlap the plurality of conductive terminals 710 in a direction orthogonal to the top surface of the substrate base 110.

Compared to the second heat dissipating structure 400a described with reference to FIG. 11C, the second heat dissipating structure 410a described with reference to FIG. 13 may further extend from the heat pipe 200 toward the second end 110S2 of the substrate base 110.

Figure 14:
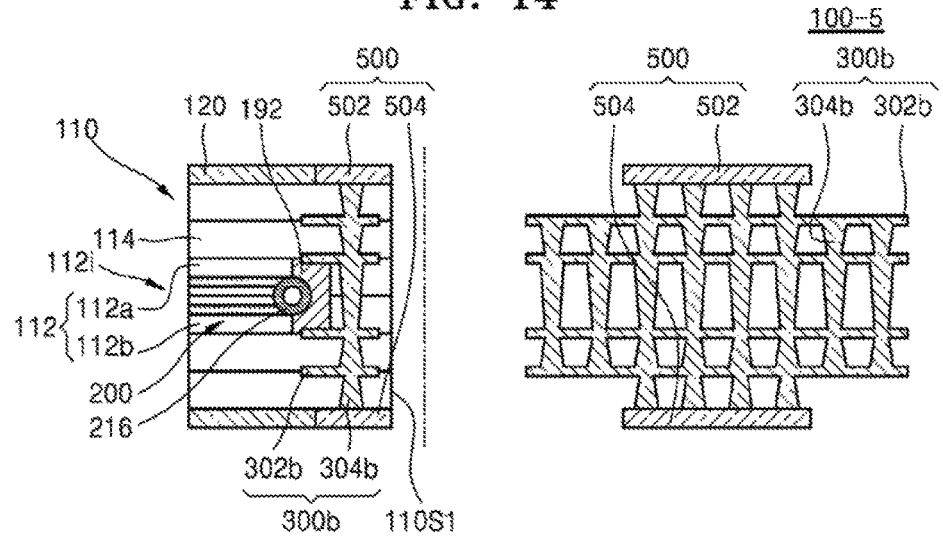
FIG. 14 is a partial cross-sectional view of a printed circuit board and a schematic view of a first heat dissipating structure according to an exemplary embodiment of the present inventive concept.

FIG. 14 is a partial cross-sectional view of a printed circuit board and a schematic view of a first heat dissipating structure according to an exemplary embodiment of the present inventive concept.

Referring to FIG. 14, a printed circuit board 100-5 may include a first heat dissipating structure 300b in the substrate base 110.

The first heat dissipating structure 300b may have a mesh-like structure including a plurality of line-shaped conductive patterns 302b and a plurality of conductive plugs 304b interconnecting the plurality of line-shaped conductive patterns 302b.

According to an exemplary embodiment of the present inventive concept, the conductive pattern 302b may be formed together with the line pattern 130 (see, e.g., FIG. 8) and the conductive plug 304b may be formed together with the through via 140 (see, e.g., FIG. 8). Thus, the first heat dissipating structure 300b may be formed together in a process for forming the line pattern 130 and the through via 140 without performing a separate process for forming the first heat dissipating structure 300b.

Figure 15:
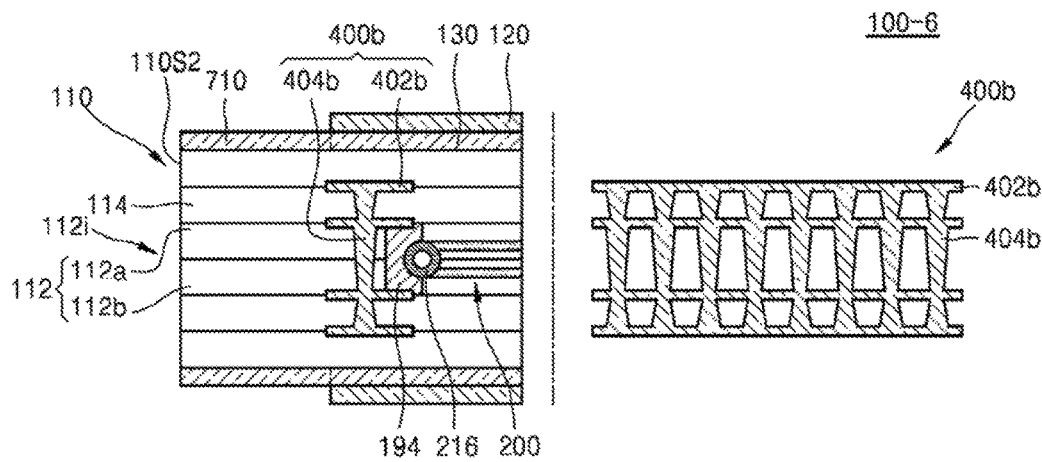
FIG. 15 is a partial cross-sectional view of a printed circuit board and a schematic view of a second heat dissipating structure according to an exemplary embodiment of the present inventive concept.

FIG. 15 is a partial cross-sectional view of a printed circuit board and a schematic view of a second heat dissipating structure according to an exemplary embodiment of the present inventive concept.

Referring to FIG. 15, a printed circuit board 100-6 may include a second heat dissipating structure 400b in the substrate base 110.

The second heat dissipating structure 400b may have a mesh-like shape including a plurality of line-shaped conductive patterns 402b and a plurality of conductive plugs 404b interconnecting the plurality of conductive patterns 402b.

According to an exemplary embodiment of the present inventive concept, the conductive pattern 402b may be formed together with the line pattern 130 (see, e.g., FIG. 8), and the conductive plug 404b may be formed together with the through via 140 (see, e.g., FIG. 8). Thus, the second heat dissipating structure 400b may be formed together in a process for forming the line pattern 130 and the through via 140 without performing a separate process for forming the second heat dissipating structure 400b.

Figure 16:
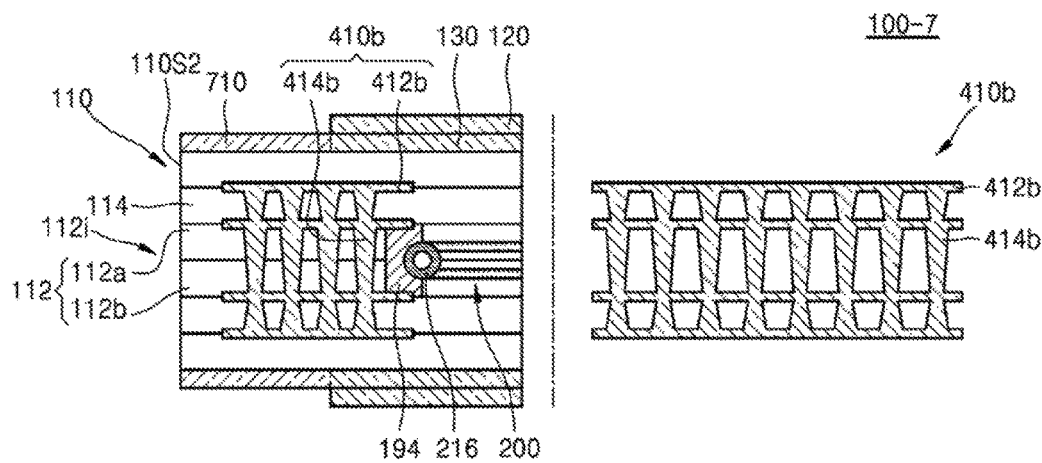
FIG. 16 is a partial cross-sectional view of a printed circuit board and a schematic view of a second heat dissipating structure according to an exemplary embodiment of the present inventive concept.

FIG. 16 is a partial cross-sectional view of a printed circuit board and a schematic view of a second heat dissipating structure according to an exemplary embodiment of the present inventive concept.

Referring to FIG. 16, a printed circuit board 100-7 may include a second heat dissipating structure 410b in the substrate base 110.

The second heat dissipating structure 410b may have a 3-dimensional mesh-like shape including a plurality of planar conductive patterns 412b and a plurality of conductive plugs 414b interconnecting the plurality of planar conductive patterns 412b.

The second heat dissipating structure 410b may overlap the plurality of conductive terminals 710 in a direction orthogonal to the top surface of the substrate base 110.

According to an exemplary embodiment of the present inventive concept, the conductive pattern 412b may be formed together with the line pattern 130 (see, e.g., FIG. 8) and the conductive plug 414b may be formed together with the through via 140 (see, e.g., FIG. 8). Thus, the second heat dissipating structure 410b may be formed together in a process for forming the line pattern 130 and the through via 140 without performing a separate process for forming the second heat dissipating structure 410b.

FIGS. 17 through 20 are each cross-sectional views of a solid state drive apparatus including a printed circuit board according to an exemplary embodiment of the present inventive concept.

Figure 17:
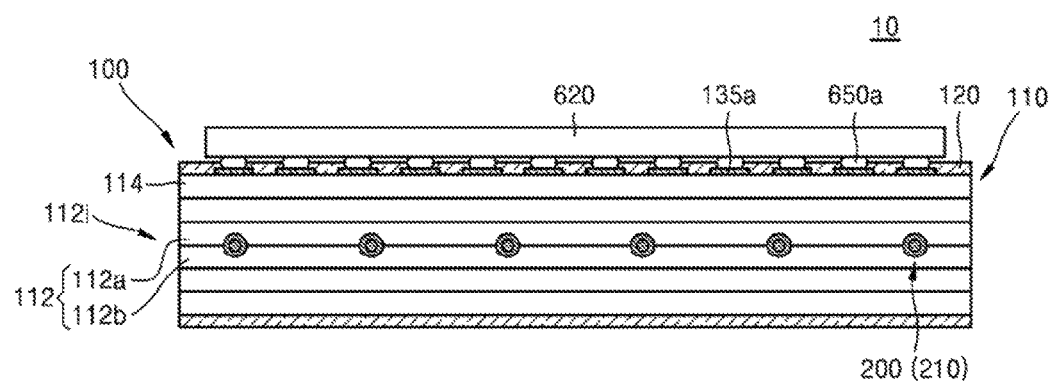
FIGS. 17 through 20 are each cross-sectional views of a solid state drive apparatus including a printed circuit board according to an exemplary embodiment of the present inventive concept.

FIG. 17 is a cross-sectional view of a solid state drive apparatus including a printed circuit board according to an exemplary embodiment of the present inventive concept. FIG. 17 is a cross-sectional diagram showing of the solid state drive apparatus 10 of FIG. 1 cut in a direction orthogonal to a line extending from the first end 100S11 to the second end 100S2 across the second semiconductor chip 620.

Referring to FIGS. 1 and 17, the solid state drive apparatus 10 may include the printed circuit board 100 and the plurality of semiconductor chips 600 disposed on the printed circuit board 100.

The second semiconductor chip 620 may be disposed on the top surface and/or the bottom surface of the substrate base 110 via a connection terminal 650a and may be connected to a pad 135a, which may be a portion of the wire pattern 130 (see, e.g., FIG. 8) not covered by the solder resist layer 120.

The second semiconductor chip 620 may overlap the heat pipe 200 (e.g., the heat absorber 210) in a direction orthogonal to the top surface of the substrate base 110. Similarly, the second semiconductor chips 620 of the solid state drive apparatuses 20, 30, 40, 50, and 60 described with reference to FIGS. 2 through 6 may overlap the heat pipes 200, 200a, 200b and 200c (e.g., the heat absorbers 210a and 210b) along the direction orthogonal to the top surface of the substrate base 110.

The first semiconductor chip 610 and/or the third semiconductor chip 630 may also overlap the heat pipe 200 (the heat absorber 210) the direction orthogonal to the top surface of the substrate base 110. Similarly, the first semiconductor chip 610 and/or the third semiconductor chip 630 of the solid state drive apparatus 40 described with reference to FIG. 4 may also overlap the heat pipe 200 (e.g., the heat absorber 210) in the direction orthogonal to the top surface of the substrate base 110.

Figure 18:
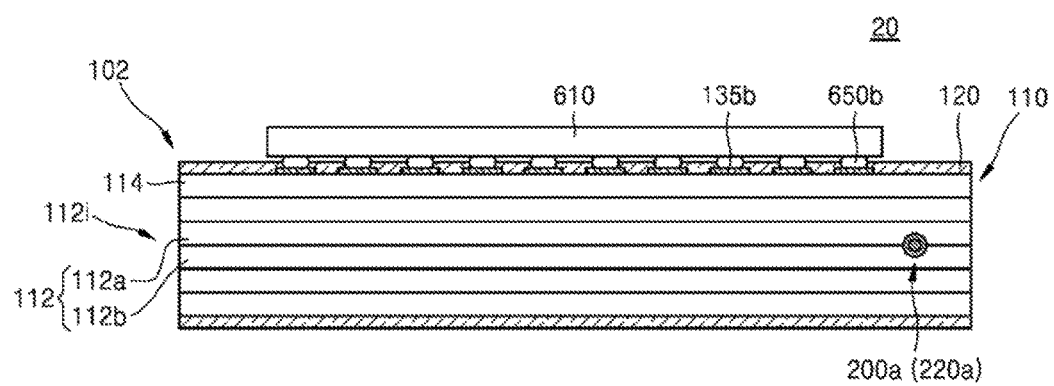
Figure 19:
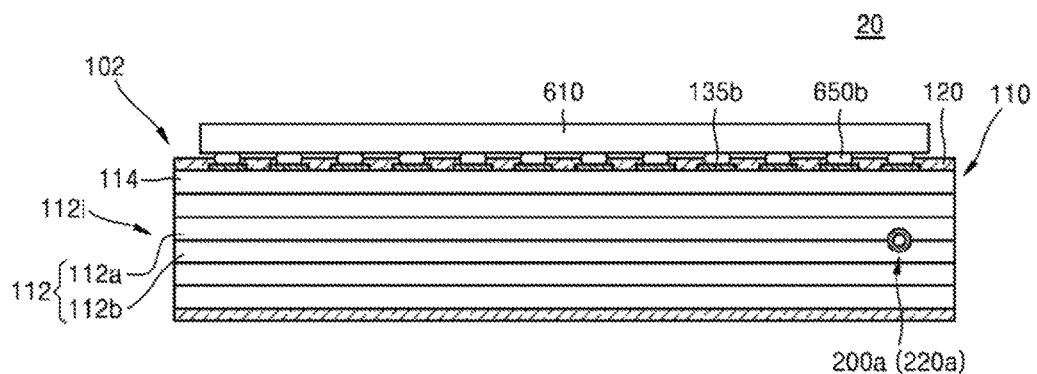

FIG. 18 is a cross-sectional view of a solid state drive apparatus including a printed circuit board according to an exemplary embodiment of the present inventive concept. FIG. 19 is a cross-sectional diagram showing the solid state drive apparatus 20 of FIG. 2 cut in a direction orthogonal to a line extending from the first end 100S1 to the second end 100S2 across the first semiconductor chip 610.

Referring to FIGS. 2 and 18, the solid state drive apparatus 20 may include the printed circuit board 102 and the plurality of semiconductor chips 600 disposed on the printed circuit board 102.

The first semiconductor chip 610 may be disposed on the top surface and/or the bottom surface of the substrate base 110 via a connection terminal 650b and may be connected to a pad 135b, which may be a portion of the conductive pattern 130 (see, e.g., FIG. 8) not covered by the solder resist layer 120.

The first semiconductor chip 610 need not overlap the heat pipe 200a (e.g., the heat transferor 220a) in a direction orthogonal to the top surface of the substrate base 110.

In the solid state drive apparatuses 30, 50, and 60 described with reference to FIGS. 3, 5, and 6, the first semiconductor chips 610 need not overlap the heat pipes 200b and 200c along the direction orthogonal to the top surface of the substrate base 110.

FIG. 19 is a cross-sectional view of a solid state drive apparatus including a printed circuit board according to an exemplary embodiment of the present inventive concept. Descriptions identical to those given above with reference to FIG. 18 may be omitted.

Referring to FIG. 19, the first semiconductor chip 610 may overlap the heat pipe 200a (e.g., the heat transferor 220a) in a direction orthogonal to the top surface of the substrate base 110. According to an exemplary embodiment of the present inventive concept, a portion of the first semiconductor chip 610 adjacent to edges of the first semiconductor chip 610 may overlap the heat transferor 220a, whereas the remaining portion of the first semiconductor chip 610 including the center portion of the first semiconductor chip 610 need not overlap the heat transferor 220a along the direction orthogonal to the top surface of the substrate base 110.

Thus, even when the first semiconductor chip 610 overlaps the heat transferor 220a, a size of the overlapping portion may be relatively small, and thus the performance of the first semiconductor chip 610 need not be reduced due to the heat transferor 220a.

Figure 20:
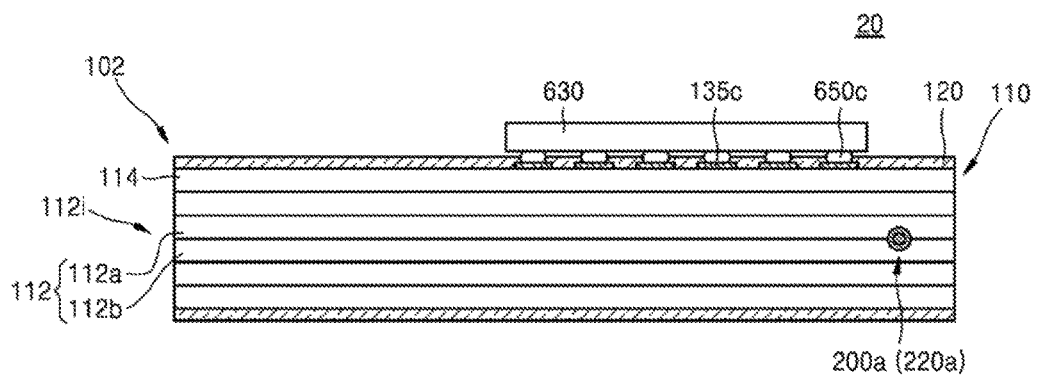

FIG. 20 is a cross-sectional view of a solid state drive apparatus including a printed circuit board according to an exemplary embodiment of the present inventive concept. FIG. 20 is a cross-sectional diagram showing the solid state drive apparatus 20 of FIG. 2 cut in a direction orthogonal to a line extending from the first end 100S1 to the second end 100S2 across the third semiconductor chip 630.

Referring to FIGS. 2 and 20, the solid state drive apparatus 20 may include the printed circuit board 102 and the plurality of semiconductor chips 600 disposed on the printed circuit board 102.

The third semiconductor chip 610 may be disposed on the top surface and/or the bottom surface of the substrate base 110 via a connection terminal 650c and may be connected to a pad 135c, which may be a portion of the conductive pattern 130 described with reference to FIG. 8 not covered by the solder resist layer 120.

The third semiconductor chip 630 need not overlap the heat pipe 200a (e.g., the heat transferor 220a) in a direction orthogonal to the top surface of the substrate base 10.

In the solid state drive apparatuses 30, 50, and 60 described with reference to FIGS. 3, 5 and 6, the third semiconductor chips 630 need not overlap the heat pipes 200b and 200c.

Figure 21:
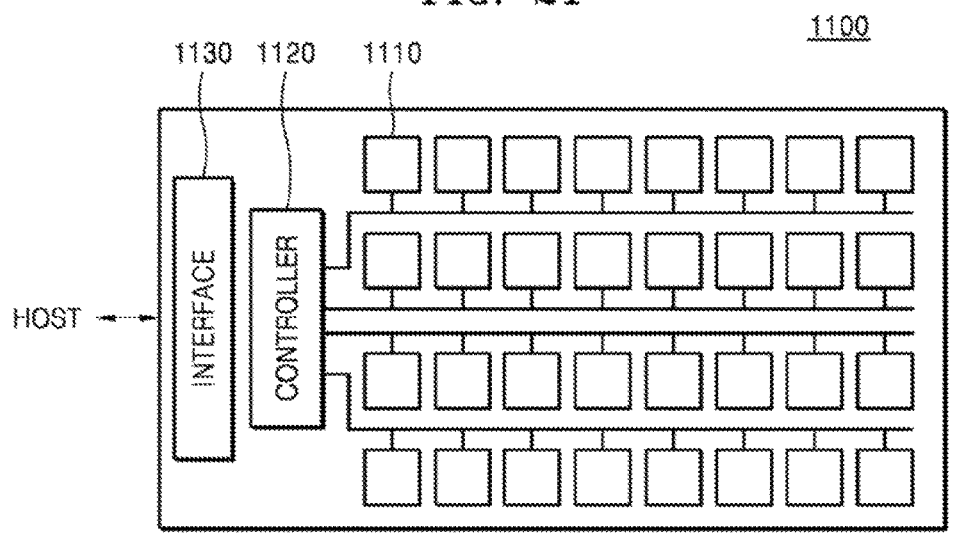
FIG. 21 is a diagram showing a configuration of a solid state drive apparatus according to an exemplary embodiment of the present inventive concept.

FIG. 21 is a diagram showing a configuration of a solid state drive apparatus according to an exemplary embodiment of the present inventive concept.

Referring to FIG. 21, a solid state drive apparatus 1100 may include a plurality of non-volatile memories 1110 and a control device 1120. The non-volatile memory 1110 may store data and may exhibit a non-volatile characteristic capable of retaining stored data even when power supply is interrupted. The solid state drive apparatus 1100 may be any one of the solid state drive apparatuses 10, 20, 30, 40, 50, and 60 described above with reference to FIGS. 1 through 20.

The control device 1120 may read data stored in the non-volatile memory 1110 or store data in the non-volatile memory 1110 in response to a read/write request of a host HOST. An interface 1130 may send a command and an address signal to the host HOST or receive those signals from the host HOST and may send the command and address signal back to the non-volatile memory 1110 or receive those signals again from the non-volatile memory 1110, via the control device 1120.

The non-volatile memory 1110 may be the first semiconductor chip 610 of any one of the solid state drive apparatus 10, 20, 30, 40, 50, and 60 described above with reference to FIGS. 1 through 20, and the control device 1120 and/or the interface 1130 may be the second semiconductor chip 620 of the solid state drive apparatus 10, 20, 30, 40, 50, and 60 described with reference to FIGS. 1 through 20.

The solid state drive apparatus 1100 may further include an active element or a passive element, such as a resistor, a capacitor, an inductance, a switch, a temperature sensor, a DC-DC converter, a quartz for generating a clock, or voltage regulator.

Figure 22:
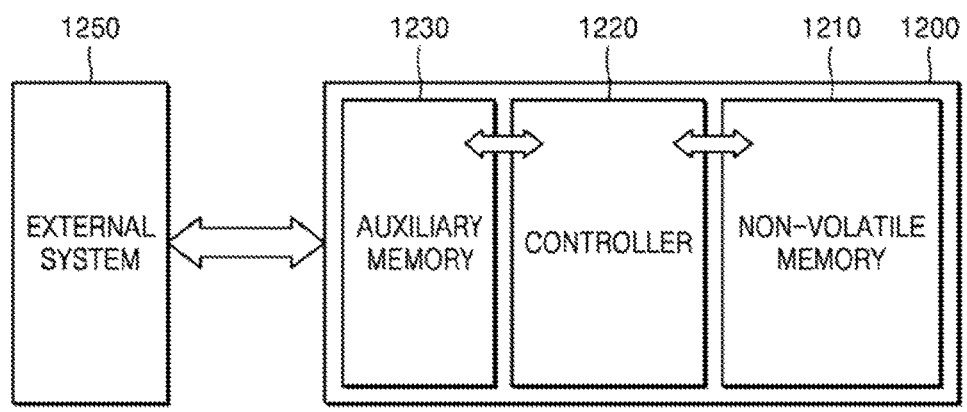
FIG. 22 is a schematic diagram showing a relationship between a solid state drive apparatus and an external system according to an exemplary embodiment of the present inventive concept.

FIG. 22 is a schematic diagram showing a relationship between a solid state drive apparatus and an external system according to an exemplary embodiment of the present inventive concept.

Referring to FIG. 22, data input from an external system 1250 may be stored in a solid state drive apparatus 1200. The solid state drive apparatus 1200 may include a non-volatile memory 1210, a controller 1220, and an auxiliary memory 1230. The solid state drive apparatus 1200 may be any one of the solid state drive apparatuses 10, 20, 30, 40, 50, and 60 described above with reference to FIGS. 1 through 20.

Data input from the external system 1250 may be stored in the non-volatile memory 1210 via the auxiliary memory 1230 and the controller 1220. The controller 1220 may also read data from the non-volatile memory 1210 via the auxiliary memory 1230 and transmit the data to the external system 1250.

The non-volatile memory 1210, the controller 1220, and the auxiliary memory 1230 may be the first semiconductor chip 610, the second semiconductor chip 620, and the third semiconductor chip 630 of the solid state drive apparatus 10, 20, 30, 40, 50, and 60 that are described above with reference to FIGS. 1 through 20, respectively.

A solid state drive apparatus according to an exemplary embodiment of the present inventive concept may transfer internally generated heat, such as heat generated by a plurality of semiconductor chips, through a heat pipe and a heat dissipating structure to a screw positioned in a screw hole or a conductive terminal of a connector, thus releasing the heat to the outside. Thus, heat generated in the solid state drive apparatus may be efficiently released to the outside, and thus the reliability of the solid state drive apparatus may be increased.

While the present inventive concept has been particularly shown and described with reference to exemplary embodiments thereof, it will be understood that various changes in form and details may be made therein without departing from the spirit and scope of the present inventive concept.

What is claimed is:

1. A printed circuit board comprising:
    a substrate base comprising a first inner base layer, a second inner base layer disposed on the first inner base layer, a plurality of cover base layers, and a screw hole extending from a top surface to a bottom surface of the substrate base, wherein at least one first cover base layer of the plurality of cover base layers is disposed on the first inner base layer, and wherein at least one second cover base layer of the plurality of cover base layers is disposed on the second inner base layer;
    a heat pipe, which is disposed along an interface between the first and second inner base layers, wherein the heat pipe comprises a sealed inner space;
    a ground conductive layer disposed on at least one of the top surface and the bottom surface of the substrate base at an edge of the screw hole; and
    a first heat dissipating structure positioned between the top and bottom surfaces of the substrate base, wherein the first heat dissipating structure is connected to the heat pipe and is in direct contact with the ground conductive layer,
    wherein the ground conductive layer comprises an upper ground conductive layer and a lower ground conductive layer respectively disposed on the top surface and the bottom surface of the substrate base at the edge of the screw hole.

2. The printed circuit board of claim 1,
wherein the first heat dissipating structure extends from the top surface of the substrate base to the bottom surface of the substrate base, and
wherein the first heat dissipating structure is in direct contact with the upper ground conductive layer and the lower ground conductive layer.

3. The printed circuit board of claim 1, wherein the screw hole is formed at a first end of the substrate base,
wherein the heat pipe is embedded in the substrate base and spaced apart from the first end of the substrate base, and
wherein the heat pipe is spaced apart from a second end of the substrate base opposite to the first end of the substrate base.

4. The printed circuit board of claim 1, further comprising a first plating layer configured to interconnect the heat pipe and the first heat dissipating structure and fill first cavities in the pair of inner base layers.

5. The printed circuit board of claim 1, wherein the heat pipe comprises a heat absorber having a shape in which a first direction passage and a second direction passage are connected to each other via a bent passage.

6. The printed circuit board of claim 5, further comprising:
a plurality of conductive terminals arranged along one end of the substrate base on at least one of the top surface and the bottom surface of the substrate base; and
a second heat dissipating structure positioned between the top and bottom surfaces of the substrate base and spaced apart from the plurality of conductive terminals, wherein the second heat dissipating structure is connected to the heat pipe.

7. The printed circuit board of claim 6, wherein at least a portion of the second heat dissipating structure overlaps the plurality of conductive terminals along a direction orthogonal to the top surface of the substrate base.

8. A solid state drive apparatus comprising:
a printed circuit board; and
a plurality of semiconductor chips disposed on the printed circuit board,
wherein the printed circuit board comprises:
a substrate base comprising a first inner base layer, a second inner base layer disposed on the first inner base layer, a plurality of cover base layers, and a screw hole extending from a top surface to a bottom surface of the substrate base, wherein at least one first cover base layer of the plurality of cover base layers is disposed on the first inner base layer, and wherein at least one second cover base layer of the plurality of cover base layers is disposed on the second inner base layer;
a first wire pattern disposed on the top surface of the substrate base and a second wire pattern disposed on the bottom surface of the substrate base, wherein each of the first and second wire patterns is connected to at least one of the plurality of semiconductor chips;
a heat pipe positioned along an interface between the first and second inner base layers, wherein the heat pipe includes a sealed inner space;
a ground conductive layer disposed on at least one of the top surface and the bottom surface of the substrate base around the screw hole; and
a first heat dissipating structure positioned between the top and bottom surfaces of the substrate base, wherein the first heat dissipating structure is connected to the heat pipe and is in direct contact with the ground conductive layer.

9. The solid state drive apparatus of claim 8, wherein a diameter of the heat pipe is smaller than a combined thickness of the first and second inner base layers.

10. The solid state drive apparatus of claim 9, wherein the heat pipe is disposed along an interface between the first inner base layer and the second inner base layer.

11. The solid state drive apparatus of claim 9, wherein the first and second wire patterns are not positioned at the interface between the first inner base layer and the second inner base layer.

12. The solid state drive apparatus of claim 8, wherein each of the plurality of semiconductor chips comprises a controller chip, at least one non-volatile memory chip, and at least one auxiliary memory chip, and
the at least one non-volatile memory chip and the controller chip are adjacent to a first end of the substrate base and a second end of the substrate base, which is opposite to the first end, respectively.

13. The solid state drive apparatus of claim 12, wherein a heat absorber overlaps each of the controller chip, the at least one non-volatile memory chip, and the at least one auxiliary memory chip along a direction orthogonal to the top surface of the substrate base.

14. The solid state drive apparatus of claim 12, wherein a heat absorber overlaps the controller chip and does not overlap the at least one non-volatile memory chip and the at least one auxiliary memory chip along a direction orthogonal to the top surface of the substrate base.

15. The solid state drive apparatus of claim 12, further comprising:
a plurality of conductive terminals arranged along one end of the substrate base on at least one of the top surface and the bottom surface of the substrate base; and
a second heat dissipating structure positioned between the top and bottom surfaces of the substrate base and spaced apart from the plurality of conductive terminals, wherein the second heat dissipating structure is connected to the heat pipe.

16. The solid state drive apparatus of claim 15, wherein a thickness of the first heat dissipating structure is greater than a thickness of the second heat dissipating structure along a direction orthogonal to the top surface of the substrate base.

17. The solid state drive apparatus of claim 9, wherein the heat pipe is spaced apart from the first and second wire patterns.

18. A solid state drive comprising:
a printed circuit board; and
a plurality of semiconductor chips disposed on the printed circuit board,
wherein the printed circuit board comprises:
a substrate base comprising a screw hole extending from a top surface to a bottom surface of the substrate base;
a ground conductive layer disposed on at least one of the top surface and the bottom surface of the substrate base around an edge of the screw hole;
a first heat dissipating structure connected with the ground conductive layer;
a heat pipe connected with the first heat dissipating structure, wherein the heat pipe is positioned between the top and bottom surfaces of the substrate base, and wherein the heat pipe comprises a first direction passage, a second direction passage, and a bent passage connecting the first and second direction passages; and a second heat dissipating structure connected with a plurality of conductive terminals positioned along a connector of the printed circuit board, wherein the second heat dissipating structure is connected to the bent passage of the heat pipe.

19. The solid state drive of claim 18, wherein the plurality of conductive terminals is positioned at an opposite end of the printed circuit board from the screw hole.

* * * * *